United States Patent
Hirler et al.

(10) Patent No.: US 9,373,692 B2
(45) Date of Patent: Jun. 21, 2016

(54) METHOD FOR FORMING A SEMICONDUCTOR DEVICE WITH AN INTEGRATED POLY-DIODE

(71) Applicant: Infineon Technologies Austria AG, Villach (AT)

(72) Inventors: Franz Hirler, Isen (DE); Anton Mauder, Kolbermoor (DE); Frank Pfirsch, Munich (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/504,781

(22) Filed: Oct. 2, 2014

(65) Prior Publication Data
US 2015/0056794 A1    Feb. 26, 2015

Related U.S. Application Data

(60) Continuation of application No. 13/849,825, filed on Mar. 25, 2013, now Pat. No. 8,878,343, which is a division of application No. 12/871,038, filed on Aug. 30, 2010, now Pat. No. 8,435,853.

(51) Int. Cl.
| | |
|---|---|
| *H01L 29/78* | (2006.01) |
| *H01L 29/66* | (2006.01) |
| *H01L 29/739* | (2006.01) |
| *H01L 21/8234* | (2006.01) |
| *H01L 29/06* | (2006.01) |
| *H01L 29/10* | (2006.01) |

(Continued)

(52) U.S. Cl.
CPC .. *H01L 29/66143* (2013.01); *H01L 21/823487* (2013.01); *H01L 29/6634* (2013.01); *H01L 29/66348* (2013.01); *H01L 29/66727* (2013.01); *H01L 29/66734* (2013.01); *H01L 29/7395* (2013.01); *H01L 29/7397* (2013.01); *H01L 29/7803* (2013.01); *H01L 29/7804* (2013.01); *H01L 29/7808* (2013.01); *H01L 29/7813* (2013.01); *H01L 29/0626* (2013.01); *H01L 29/1095* (2013.01); *H01L 29/41766* (2013.01); *H01L 29/456* (2013.01); *H01L 29/4933* (2013.01); *H01L 29/6609* (2013.01)

(58) Field of Classification Search
CPC ............ H01L 29/6603; H01L 29/6609; H01L 29/66106; H01L 29/66136; H01L 29/7808; H01L 29/7821; H01L 29/861; H01L 29/866
See application file for complete search history.

(56) References Cited

U.S. PATENT DOCUMENTS

| | | |
|---|---|---|
| 6,049,108 A | 4/2000 | Williams et al. |
| 6,566,708 B1 | 5/2003 | Grover et al. |

(Continued)

*Primary Examiner* — Evan Pert
*Assistant Examiner* — Leslie Pilar Cruz
(74) *Attorney, Agent, or Firm* — Murphy, Bilak & Homiller, PLLC

(57) ABSTRACT

A method for forming a field effect power semiconductor device includes providing a semiconductor body comprising a main horizontal surface and a conductive region arranged next to the main horizontal surface, forming an insulating layer on the main horizontal surface, and etching a narrow trench through the insulating layer so that a portion of the conductive region is exposed, the narrow trench comprising, in a given vertical cross-section, a maximum horizontal extension. The method further includes forming a vertical poly-diode structure comprising a horizontally extending pn-junction. Forming the vertical poly-diode structure includes depositing a polycrystalline semiconductor layer comprising a minimum vertical thickness of at least half of the maximum horizontal extension and maskless back-etching of the polycrystalline semiconductor layer to form a polycrystalline region in the narrow trench.

10 Claims, 30 Drawing Sheets

(51) Int. Cl.
*H01L 29/417* (2006.01)
*H01L 29/45* (2006.01)
*H01L 29/49* (2006.01)

(56) References Cited

U.S. PATENT DOCUMENTS

| | | |
|---|---|---|
| 6,737,705 B2 | 5/2004 | Momota et al. |
| 6,762,440 B1 | 7/2004 | Pairitsch et al. |
| 7,098,488 B2 | 8/2006 | Yoshikawa et al. |
| 7,504,303 B2 | 3/2009 | Yilmaz et al. |
| 7,709,887 B2 | 5/2010 | Hille et al. |
| 2002/0127781 A1* | 9/2002 | Gonzalez et al. ............ 438/129 |
| 2006/0008975 A1* | 1/2006 | Gonzalez et al. ............ 438/237 |
| 2006/0076613 A1* | 4/2006 | Ohyanagi et al. ............ 257/330 |
| 2007/0145411 A1* | 6/2007 | Chen et al. ................... 257/173 |
| 2009/0146177 A1 | 6/2009 | Ng et al. |
| 2011/0084335 A1 | 4/2011 | Lin et al. |

\* cited by examiner

US 9,373,692 B2

METHOD FOR FORMING A SEMICONDUCTOR DEVICE WITH AN INTEGRATED POLY-DIODE

PRIORITY CLAIM

This application is a Continuation of U.S. application Ser. No. 13/849,825, filed on 25 Mar. 2013, which in turn is a Divisional of U.S. application Ser. No. 12/871,038, filed on 30 Aug. 2010 (now U.S. Pat. No. 8,435,853), the content of both of said applications incorporated herein by reference in their entirety.

FIELD OF THE INVENTION

This specification refers to embodiments of methods for forming a semiconductor device having an integrated poly-diode structure. Furthermore, this specification refers to embodiments of semiconductor devices with an integrated poly-diode, in particular to a trench gate field effect semiconductor device having an integrated poly-diode.

BACKGROUND

Many functions of modern devices in automotive, consumer and industrial applications such as converting electrical energy and driving an electric motor or an electric machine rely on semiconductor devices. It is often desirable that the semiconductor devices operate reliably with high slew rate, at low loss and with limiting the short circuit current e.g. at a failure of the load. To optimize device performance with respect to short circuit limitation and switching behavior, floating gates and floating semiconductor regions have been found to be useful in many applications. For example, a so called spaced-channel power IGBT (Insulated Gate Bipolar Transistor) has both a low on-voltage and a low switching loss so that the total loss is low. In a spaced-channel power IGBT, the channel regions (body regions) are spaced from each other by carrier storing floating regions. At least for reason of useful levels of the short circuit current, it is often desired to clamp the voltage fluctuations of the floating region in such devices. For gate electrodes and floating gate electrodes, a limitation of the voltage is often desirable e.g. for protecting the gate dielectric or for limiting short circuit current, respectively. For example, a power semiconductor device such as a power IGBT operating in a power converter or as a driver or switch of an electric motor may be exposed to high reverse currents and/or voltages during switching or an operating cycle. This may cause heavy voltage oscillations of the floating gate electrode and hence high stress for the gate dielectric. Accordingly, clamping circuits may be used to limit voltage fluctuations. For example, a pn-diode switched between the source or the gate driver and the floating semiconductor region and/or the floating gate may be used to limit the voltage fluctuations to the threshold voltage of the diode. Integrated diodes are often desirable to reduce handling requirements and to avoid additional inductivities. The integration of additional diodes is, however, often associated with increased processing requirements and costs.

For these and other reasons there is a need for the present invention.

SUMMARY

According to one embodiment of a method for forming a field effect power semiconductor device, the method includes providing a semiconductor body comprising a main horizontal surface and a conductive region arranged next to the main surface, forming an insulating layer on the main horizontal surface and etching a narrow trench through the insulating layer so that a portion of the conductive region is exposed. The narrow trench comprises, in a given vertical cross-section, a maximum horizontal extension. The method further includes forming a vertical poly-diode structure comprising a horizontally extending pn-junction. The vertical poly-diode structure is formed by depositing a polycrystalline semiconductor layer comprising a minimum vertical thickness of at least half of the maximum horizontal extension and maskless back-etching of the polycrystalline semiconductor layer to form a polycrystalline region in the narrow trench.

According to an embodiment of a method for forming a trench gate field effect semiconductor device, the method includes providing a semiconductor body comprising a main horizontal surface and a gate electrode structure comprising a conductive region arranged in a deep trench disposed in the semiconductor body. The deep trench includes, in a given vertical cross-section, a horizontal extension. The method further includes forming an insulating layer on the main horizontal surface so that the insulating layer covers the conductive region and etching a narrow trench through the insulating layer so that a portion of the conductive region is exposed. The narrow trench includes, in the vertical cross-section, a maximum horizontal extension smaller than the horizontal extension of the deep trench. The method also includes forming an integrated vertical poly-diode structure comprising a horizontally extending pn-junction. The integrated vertical poly-diode structure is formed by depositing a polycrystalline semiconductor layer so that the narrow trench is completely filled and maskless back-etching the polycrystalline semiconductor layer to form a polycrystalline region in the narrow trench.

According to an embodiment of a method for forming a semiconductor device, the method includes providing a semiconductor body comprising a main horizontal surface and a first semiconductor region of a first conductivity type extending to the main horizontal surface, forming a second semiconductor region of a second conductivity type so that a pn-junction is formed between the first semiconductor region and the second semiconductor region and forming a deep trench extending from the main horizontal surface into the semiconductor body. The method further includes forming a thin insulating layer at least on side walls of the deep trench, forming a conductive region in the deep trench, forming an insulating layer on the main horizontal surface, etching a narrow trench through the insulating layer at least to the conductive region, depositing a polycrystalline semiconductor layer so that the narrow trench is completely filled and forming a first metallization on the insulating layer. The deep trench extends vertically below the pn-junction. A current path includes a rectifying junction formed through the polycrystalline semiconductor layer in the narrow trench between the first metallization and the conductive region.

According to another embodiment of a method for forming a semiconductor device, the method includes providing a semiconductor body comprising a main horizontal surface and a first semiconductor region of a first conductivity type extending to the main horizontal surface, forming a second semiconductor region of a second conductivity type so that a pn-junction is formed between the first semiconductor region and the second semiconductor region, and forming a further semiconductor region of a second conductivity type so that a further pn-junction is formed between the first semiconductor region and the further semiconductor region. The method further includes forming a deep trench extending from the main horizontal surface into the semiconductor body and vertically below the pn-junction, forming a thin insulating layer at least on side walls of the deep trench, forming a conductive region in the deep trench, and forming an insulating layer on the main horizontal surface so that the insulating layer covers at least the further semiconductor region and the conductive region. The method also includes etching a narrow trench through the insulating layer so that the further semiconductor region is exposed, depositing a polycrystalline semiconductor layer so that the narrow trench is at least completely filled, maskless back-etching of the polycrystalline semiconductor layer to form a first polycrystalline region in the narrow trench, and forming a first metallization on the insulating layer so that a current path comprising a rectifying junction is formed through the narrow trench and between the first metallization and the further semiconductor region.

According to an embodiment of a field effect semiconductor device, the device includes a semiconductor body including a main horizontal surface and a first semiconductor region of a first conductivity type. A second semiconductor region of a second conductivity type is arranged between the first semiconductor region and the main horizontal surface. The first semiconductor region and the second semiconductor region form a pn-junction. An insulating layer is arranged on the main horizontal surface, a first metallization is arranged on the insulating layer and a deep trench extends from the main horizontal surface vertically below the pn-junction. The deep trench includes a conductive region insulated from the first semiconductor region and the second semiconductor region. A narrow trench includes a polycrystalline semiconductor region extending from the first metallization, through the insulating layer and at least to the conductive region. A vertical poly-diode structure includes a horizontally extending pn-junction. The vertical poly-diode structure is arranged at least partly in the narrow trench.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
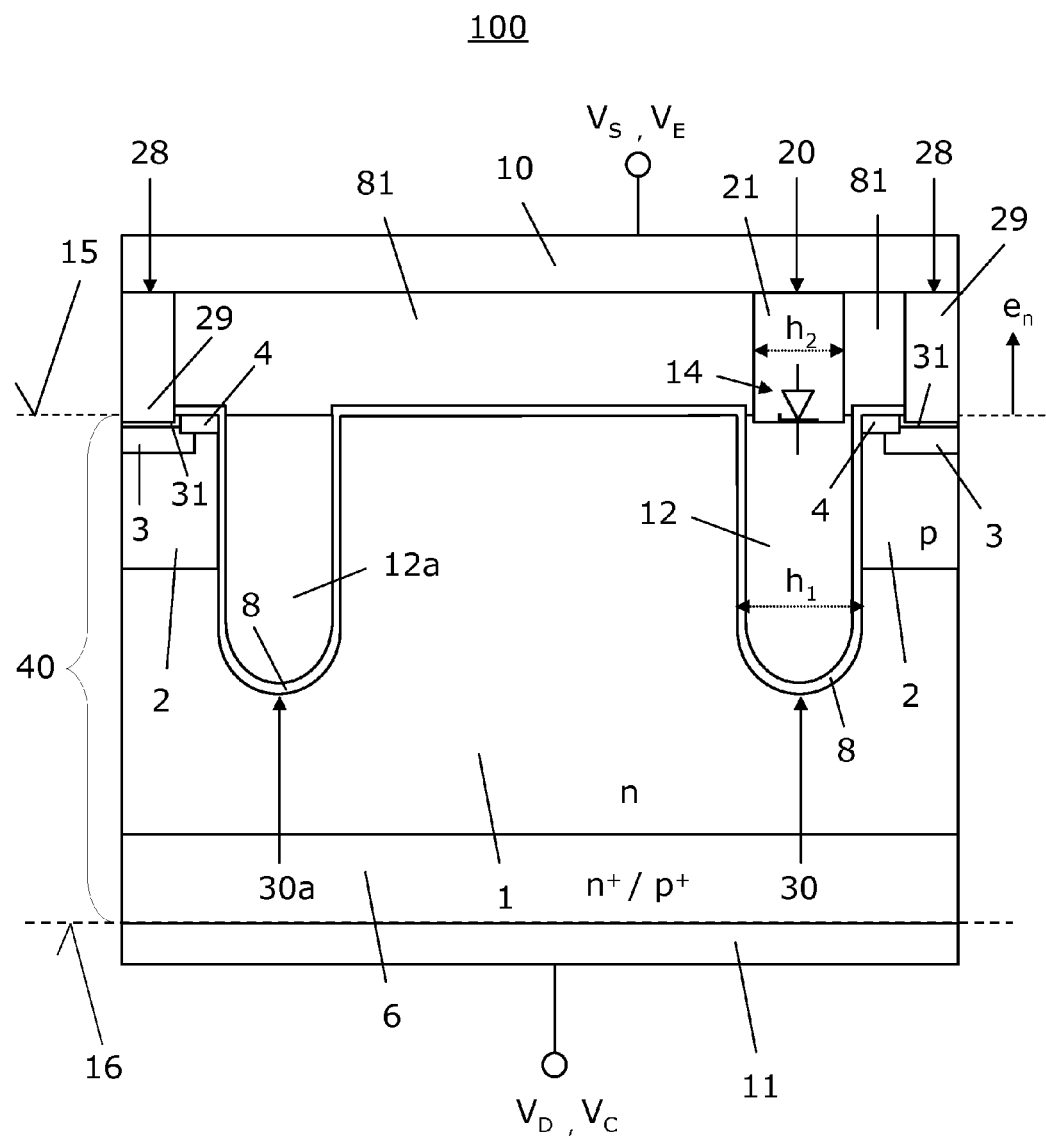
FIG. 1 schematically illustrates a vertical cross-section of a vertical semiconductor device according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. The semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+ regions can have different absolute doping concentrations. The same applies, for example, to an n+ and a p+ region.

Specific embodiments described in this specification pertain to, without being limited thereto, field effect transistors, in particular to power field effect transistors. The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in ohmic contact with a drain or collector electrode. The source region or emitter region is in ohmic contact with a source or emitter electrode. Without applying an external voltage between the gate electrode and the source or emitter electrode, the ohmic current path between the source or emitter electrode and the drain or collector electrode through the semiconductor device is broken or at least high ohmic in normally-off field effect devices. In normally-on field effect devices such as HEMTs (High Electron Mobility Transistors) and normally-on JFETs (Junction-FETs), the current path between the source electrode and the drain electrode through the semiconductor device is typically low ohmic without applying an external voltage between the gate electrode and the source or emitter electrode.

In the context of the present specification, the term "field-effect structure" intends to describe a structure formed in a semiconductor substrate or semiconductor device having a gate electrode for forming and or shaping a conductive channel in the channel region. The gate electrode is at least insulated from the channel region by a dielectric region or dielectric layer.

In the context of the present specification, the terms "field plate" and "field electrode" intend to describe an electrode which is arranged next to a semiconductor region, typically a drift region, insulated from the semiconductor region, and configured to expand a depleted portion in the semiconductor region by applying an appropriate voltage, typically a negative voltage for an n-type drift region.

The terms "depleted" and "completely depleted" intend to describe that a semiconductor region comprises substantially no free charge carriers. Typically, insulated field plates are arranged close to pn-junctions formed e.g. between a drift region and a body region. Accordingly, the blocking voltage of the pn-junction and the semiconductor device, respectively, may be increased. The dielectric layer or region which insulates the field plate from the drift region in the following also referred to a field dielectric layer or field dielectric region. The gate electrode and the field plate may be on same electrical potential or on different electrical potential. The field plate may be on source or emitter potential. Furthermore, a portion of the gate electrode may be operated as field electrode.

Examples of dielectric materials for forming a dielectric region or dielectric layer between the gate electrode or a field plate and the drift region include, without being limited thereto, $SiO_2$, $Si_3N_4$, $SiO_xN_y$, $Al_2O_3$, $ZrO_2$, $Ta_2O_5$, $TiO_2$ and $HfO_2$.

The terms "power field effect transistor" and "power semiconductor device" as used in this specification intend to describe a field effect transistor on a single chip with high voltage and/or high current switching capabilities. In other words, power field effect transistors are intended for high current, typically in the Ampere range, and/or high voltages, typically above 20 V, more typically above 400 V.

According to an embodiment, method for forming a field effect power semiconductor device is provided. The method includes providing a semiconductor body having a main horizontal surface and a conductive region arranged next to the main surface. An insulating layer is formed on the main horizontal surface. A narrow trench is etched through the insulating layer such that a portion of the conductive region is exposed. The narrow trench has, in a given vertical cross-section, a maximum horizontal extension. A vertical poly-diode structure having a horizontally extending pn-junction is formed. Forming the vertical poly-diode structure includes depositing a polycrystalline semiconductor layer having a mini-mum vertical thickness of at least the half of the maximum horizontal extension. Forming the vertical poly-diode structure further includes maskless back-etching of the polycrystalline semiconductor layer to form a polycrystalline region in the narrow trench.

According to an embodiment, a method for forming a field effect power semiconductor device is provided. The method includes providing a semiconductor body having a main horizontal surface, a conductive region arranged next to the main surface, and an insulating layer arranged on the main horizontal surface. A narrow trench is etched through the insulating layer such that the conductive region is partially exposed. A polycrystalline semiconductor layer is deposited and a vertical poly-diode structure is formed. The polycrystalline semiconductor layer has a minimum vertical thickness which is equal to or larger than the half of the maximum horizontal extension of the narrow trench in a vertical cross-section. Forming the poly-diode structure includes maskless back-etching of the polycrystalline semiconductor layer to form a polycrystalline region in the narrow trench. The narrow trench may extend into the semiconductor body.

According to an embodiment, a field effect semiconductor device having a semiconductor body with a main horizontal surface is provided. The semiconductor body includes a first semiconductor region of a first conductivity type, a second semiconductor region of a second conductivity type which is arranged between the first semiconductor region and the main horizontal surface, an insulating layer arranged on the main horizontal surface, and a first metallization arranged on the insulating layer. The first semiconductor region and the second semiconductor region form a pn-junction. A deep trench extends from the main horizontal surface vertically below the pn-junction. The deep trench includes a conductive region which is insulated from the first semiconductor region and the second semiconductor region. A narrow trench extends from the first metallization, through the insulating layer and at least to the conductive region. The narrow trench includes a polycrystalline semiconductor region. The field effect semiconductor device further includes a vertical poly-diode structure which is at least partly arranged in the narrow trench and includes a pn-junction.

FIG. 1 illustrates an embodiment of a semiconductor device 100 in a section of a vertical cross-section. Typically, semiconductor device 100 is a power semiconductor device. In this case, the shown section typically corresponds to one of a plurality of unit cells in an active area of power semiconductor device 100. The semiconductor device 100 includes a semiconductor body 40 having a first or main horizontal surface 15 and a second surface 16 or back surface 16 arranged opposite to the first surface 15. The normal direction $e_n$ of the first surface 15 is substantially parallel to, i.e. defines, the vertical direction.

In the following, embodiments pertaining to semiconductor devices and manufacturing methods therefore, respectively, are explained mainly with reference to silicon (Si) semiconductor devices. Accordingly, a monocrystalline semiconductor region or layer is typically a monocrystalline Si-region or Si-layer. It should however be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN) and gallium nitride (GaN) or silicon-silicon carbide ($Si_xC_{1-x}$) and SiGe heterojunction semiconductor material. For power semiconductor applications currently mainly Si, SiC and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$. It should further be understood that a semiconductor body may also include polycrystalline semiconductor regions. For example, a trench gate electrode or a field electrode arranged in an insulated trench may be formed by highly doped n-type of p-type polycrystalline semiconductor regions such as poly-Silicon. Accordingly, the term "exposing a semiconductor body" as used in this specification intends to describe exposing a monocrystalline semiconductor region of the semiconductor body and/or exposing a polycrystalline semiconductor region arranged in the semiconductor body.

Semiconductor body 40 includes an n-type first semiconductor region 1, a p-type second semiconductor region 2 which is arranged between first semiconductor region 1 and the main horizontal surface 15. The first semiconductor region 1 and the second semiconductor region 2 form a pn-junction. An $n^+$-type fourth semiconductor region 4 which extends to main surface 15 forms an additional pn-junction with the second semiconductor region 2. Second, third and fourth semiconductor regions 2, 3, 4 may be shaped as bars which extend out of the drawing plane. In this case, each of the shown separated pairs of second, third and fourth semiconductor regions 2, 3, 4 correspond to two separated regions. Second, third and fourth semiconductor regions 2, 3, 4 may however also be ring-shaped. In this case, each of the shown separated pairs of second, third and fourth semiconductor regions 2, 3, 4 correspond to a respective simply connected semiconductor region.

An insulating layer 81, which is in the following also referred to as intermediate dielectric layer 81, is arranged on main horizontal surface 15. A first metallization 10 is arranged on insulating layer 81. A second metallization 11 is arranged on back surface 16. Semiconductor device 100 includes gate electrode structures arranged in deep trenches 30, 30a. Accordingly, semiconductor device 100 may be operated as a vertical field effect semiconductor device which switches and/or controls a load current between the two metallizations 10, 11. Typically, first semiconductor region 1, second semiconductor region 2 and third semiconductor region 3 form a drift region 1, a body region 2 and a source or emitter region 4, respectively.

Semiconductor device 100 may form a MOSFET. In this case, drift region 1 is in ohmic connection with the second metallization 11 forming a drain electrode 11 via an $n^+$-type drain contact region 6 formed by a sixth semiconductor region 6. Further, first metallization 10 forms a source electrode 10 which is in ohmic connection with source region 2 and via a $p^+$-type body contact region 3 with body region 2. The doping concentrations of source region 3 and body contact region 3 are typically higher than the doping concentration of drift region 1.

In the context of the present specification, the terms "in ohmic contact", "in electric contact", "in contact", "in ohmic connection", and "electrically connected" intend to describe that there is an ohmic electric connection or ohmic current path between two regions, portion or parts of a semiconductor devices, in particular a connection of low ohmic resistance, even if no voltages are applied to the semiconductor device.

Semiconductor device 100 may also form an IGBT. In this case, a $p^+$-type sixth semiconductor region 6 forming a collector region 6 is arranged between drift region 1 and the second metallization 11 forming a collector electrode 11. Further, first metallization 10 forms a emitter electrode 10 which is in ohmic connection with emitter region 2 and via a $p^+$-type body contact region 3 with body region 2. Sixth semiconductor region 6 may also include n-type and p-type portions so that semiconductor device 100 may be operated as an IGBT with integrated free-wheeling diode.

The doping relations of the semiconductor regions may also be reversed. In addition, further semiconductor regions may be arranged between first semiconductor region 1 and sixth semiconductor region 6. For example, a field stop layer or region may be arranged between first semiconductor region 1 and sixth semiconductor region 6.

For switching and/or controlling a load current between the two metallizations 10, 11 at least one trench gate electrode is provided. In the exemplary embodiment illustrated in FIG. 1, two deep trenches 30, 30a extend from the main horizontal surface 15, through the second semiconductor region 2, the fourth semiconductor region 4 and partially into the first semiconductor region 1. In other words, the deep trenches 30, 30a extends vertically below the pn-junction formed between the drift region 1 and the body region 2. The deep trenches 30, 30a are insulated from semiconductor body 40 by a thin dielectric layer 8 and include respective conductive regions 12, 12a. The thin dielectric layer 8 is in the following also referred to as gate dielectric layer 8. At high enough voltage difference between body region 2 and the respective adjacent conductive regions 12, 12a, an inversion channel is formed in body region 2 along gate dielectric layer 8 between drift region 1 and source or emitter region 4. Accordingly, a load current may be switched and/or controlled. Typically, conductive region 12a forms a gate electrode which is electrically connected to a gate metallization (not shown). Lower portions of conductive regions 12a and/or 12 may also form a field electrode. In this case, thin dielectric layer 8 is typically thickened in the respective lower trench portion to form a field oxide.

A narrow trench 20 extends from the first metallization 10, through insulating layer 81 and to or into the conductive region 12. The maximum horizontal extension of narrow trench 20 is, in the shown cross-section, typically in a range of about 0.2 µm to about 4 µm, more typically in a range of about 0.5 µm to about 2 µm. in some embodiment, maximum horizontal extension of narrow trench 20 is referred to as second horizontal extension.

Narrow trench 20 is filled with a polycrystalline semiconductor region 21. According to an embodiment, conductive region 12 is a polycrystalline semiconductor 12 of a first conductivity type, for example an n-type polycrystalline semiconductor region 12, and polycrystalline semiconductor region 21 is of a second conductivity type, for example p-type. Accordingly, a vertical poly-diode 14 which is partly arranged in narrow trench 20 is formed between first metallization 10 and conductive region 12. In so doing, the voltage difference between conductive region 12 and first metallization 10 is limited in forward direction of poly-diode 14 to its threshold voltage and in backward direction of poly-diode 14 to its breakdown voltage. In the following, conductive region 12 is also referred to as clamped gate electrode 12. Compared to a similar semiconductor structure but with a free floating gate electrode, rising of the potential of clamped gate electrode 12 may be limited to a value providing low short circuit density or not jeopardizing dielectric insulation capability of gate dielectric 30. Thus, the short circuit properties and/or integrity of gate dielectric of semiconductor device 100 are typically improved.

In the context of the present specification, the term "poly-diode", intends to describe a pn-diode which is formed between a polycrystalline semiconductor region of a first conductivity type and a semiconductor region of a second conductivity type. The semiconductor region of the second conductivity type may be a monocrystalline semiconductor region or a polycrystalline semiconductor region.

According to an embodiment, poly-diode 14 is a Zener-diode typically having a significantly reduced breakdown voltage compared to normal pn-diodes. Accordingly, the voltage fluctuations of clamped gate electrode 12 are further reduced. The term "Zener diode" as used in this specification intends to describe a diode that permits current with reverse biased pn-junction.

According to an embodiment, a serial connection of a not shown resistor and a poly-diode 14, typically a Zener-diode is provided through narrow trench 20.

In the cross-sectional view of FIG. 1, the maximum horizontal extension $h_2$ of narrow trench 20 is smaller than the first maximum horizontal extension $h_1$ of deep vertical trench 30. Accordingly, only the clamped gate electrode 12 is contacted via narrow trench 20. Further, narrow trench 20 extends typically only to or slightly below main horizontal surface 15, whereas deep trench 30 extends from main horizontal surface vertically into semiconductor body 40. In other words, narrow trench 20 is at least partially arranged above deep trench 30.

According to an embodiment, semiconductor device 100 further includes further narrow trenches 28 which extend from first metallization 10 at least to semiconductor body 40 to electrically contact body contact regions 3 and source or emitter regions 2 through conductive plugs 29. Narrow trench 20 and narrow trenches 28 may be formed in a common process. This facilitates processing of semiconductor device 100. In addition, the further trenches 28 may be filled with the same polycrystalline semiconductor material as narrow trench 20. In order to form an ohmic connection, a silicide layer 31, for example a silicide layer based on tungsten or titanium or tantalum or cobalt, is formed between polycrystalline conductive plug 29 and body contact region 3 and between polycrystalline conductive plug 29 and source or emitter region 2.

According to an embodiment, the two deep trenches 30 and 30a are formed in a common etching process and filled with the same polycrystalline semiconductor material. This also facilitates manufacturing of semiconductor device 100.

According to an embodiment, gate electrode 12a is also connected to a not shown gate metallization through another narrow trench such that a further poly-diode structure is formed between gate electrode 12a and the gate metallization. This narrow trench may only be visible in another vertical cross-section of semiconductor device 100.

Figure 2:
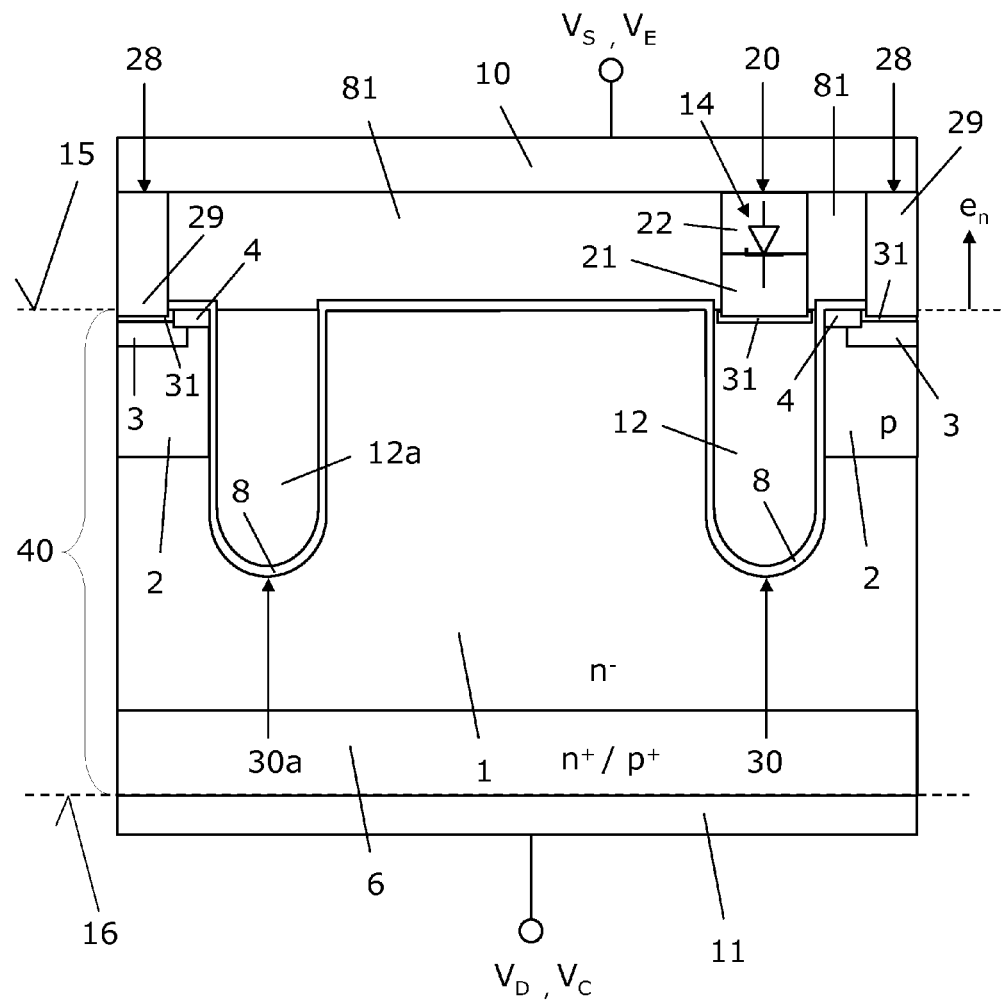
FIG. 2 schematically illustrates a vertical cross-section of a vertical semiconductor device according to one or more embodiments.

FIG. 2 illustrates an embodiment of a semiconductor device 101 in a section of a vertical cross-section. Semiconductor device 101 is similar to semiconductor device 100. However, narrow trench 20 additionally includes a further polycrystalline semiconductor region 22 which is arranged between polycrystalline semiconductor region 21 and first metallization 10. The conductivity type of the further polycrystalline semiconductor region 22 is opposite (p-type) to the conductivity type of polycrystalline semiconductor region 21 (n-type). As illustrated in FIG. 2, a substantially horizontally extending pn-junction is formed between the polycrystalline semiconductor regions 21 and 22. In other words, narrow trench 20 includes a vertical poly-diode 14.

In the exemplary embodiment illustrated in FIG. 2, a silicide layer 31 is also arranged between polycrystalline semiconductor regions 21 and conductive region 12 to provide an ohmic contact between poly-diode 14 arranged in narrow trench 20 and conductive region 21. Accordingly, the material properties of the conductive region 12 may be chosen independently from the material properties of the poly-diode 14. The silicide layer 31 between conductive region 12 and polycrystalline semiconductor region 21 is however only optional.

In an embodiment, conductive region 12 and polycrystalline semiconductor region 21 are both polycrystalline semiconductor regions of the same conductivity type, but may have different doping concentrations and/or vertical doping profiles. In this embodiment a silicide layer between conductive region 12 and polycrystalline semiconductor region 21 may be omitted. In another embodiment, conductive region 12 and polycrystalline semiconductor region 21 are both polycrystalline semiconductor regions but of opposite conductivity typ. For example, further polycrystalline semiconductor region 22 is of p-type, whereas polycrystalline semiconductor region 21 is an n-type semiconductor region. In such a device and without the silicide layer 31 between conductive region 12 and polycrystalline semiconductor region 21, a poly-diode chain or poly-diode stack of two poly-diodes is formed between first metallization 1 and conductive region 12.

Depending on doping type of sixth semiconductor region 6, semiconductor device 101 may be operated as a MOSFET or an IGBT.

Clamping a gate electrode via one or more narrow trenches as described herein may also be used for clamping a gate electrode of a MOS-controlled thyristor.

Figure 3:
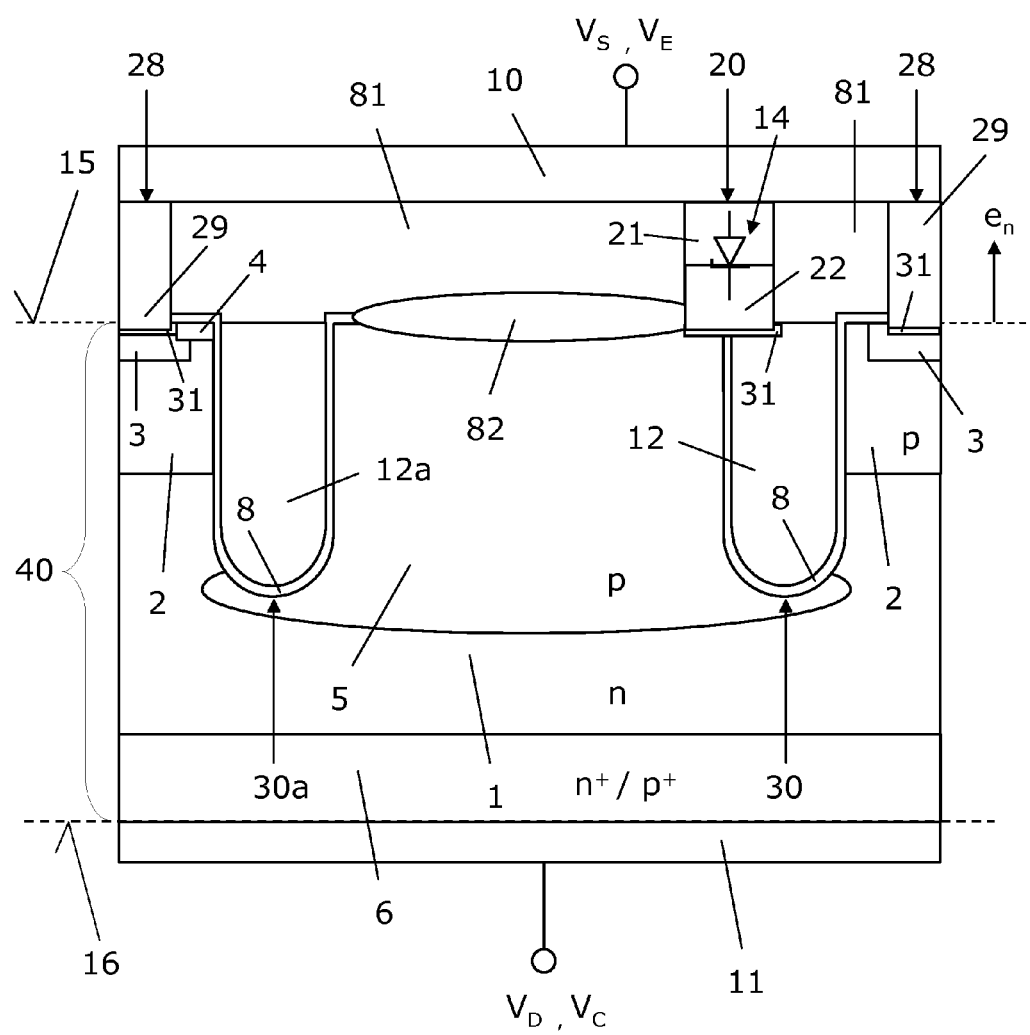
FIG. 3 schematically illustrates vertical cross-sections of vertical semiconductor devices according to one or more embodiments.

FIG. 3 illustrates an embodiment of a semiconductor device 102 in a section of a vertical cross-section. Semiconductor device 102 is similar to semiconductor device 101. However, semiconductor device 102 further includes a semiconductor region 5 of the second conductivity type which is also clamped via narrow trench 20. Accordingly, the voltage fluctuations between semiconductor region 5 and first metallization 10 are limited in forward direction of poly-diode 14 to its threshold voltage and in backward direction of poly-diode 14 to its breakdown voltage. In other words, a further clamping current path with a rectifying junction is formed through narrow trench 20 and between the first metallization 10 and semiconductor region 5. Thus, short circuit properties of semiconductor device 102 are typically improved compared to a similar spaced channel field effect device but without clamping the floating body between adjoining deep trenches. Semiconductor region 5 is in the following also referred to as conductive region 5, clamped conductive region 5 and clamped body region 5, respectively. Clamped body region 5 is, in the shown vertical cross-section, spaced apart from the body regions 2 by the deep trenches 30, 30a. In the exemplary embodiment illustrated in FIG. 3, clamped body region 5 extends vertically below deep trenches 30, 30a. In another embodiment, deep trenches 30, 30a extend vertically below clamped body region 5. For example, clamped body region 5 and body regions 2 may extend into the same vertical depth.

Semiconductor device 102 is typically also a power semiconductor device. Accordingly, the insulating layer 8 on main surface 15 between the two trenches 30, 30a may be thickened in vertical direction to better decouple unit cells of the power semiconductor device. For example, an additional LOCOS (LOCal Oxidation of Silicon) region 82 may be formed above clamped body region 5. Trench 20 of semiconductor device 102 extends from first metallization 10 through intermediate dielectric layer 81, through LOCOS-region 82 and through portions of thin dielectric layer 8 which are arranged on main horizontal surface 15. In the exemplary embodiment of FIG. 3, conductive region 12 in deep trench 30 may be operated as a field electrode 12. During operation, field electrode 12 is clamped via poly-diode 14 arranged in narrow trench 20 to source potential $V_S$ and emitter potential $V_E$, respectively. Different to semiconductor devices 100 and 101, for example, no fourth semiconductor region 4 is provided next to deep trench 30 and conductive region 12, respectively, of semiconductor device 102. Accordingly, forming of a current-carrying channel region next to the field electrode 12 is typically avoided. A current-carrying channel region may be formed during operation of semiconductor device 102 in body region 2 next to deep trench 30a by appropriately biasing conductive region 12a which is arranged in trench 30a and forms a gate electrode 12a.

Figure 4:
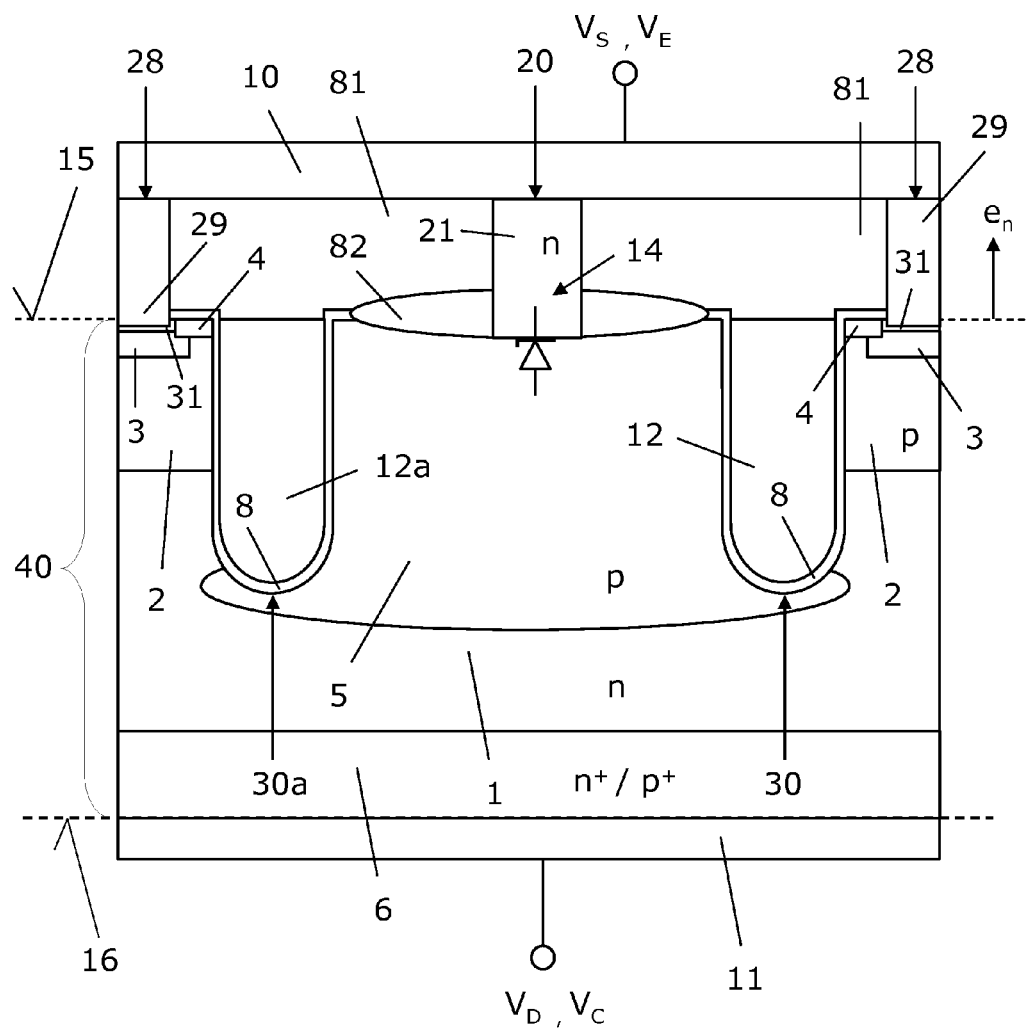
FIG. 4 schematically illustrates a vertical cross-section of a vertical semiconductor device according to one or more embodiments.

FIG. 4 illustrates an embodiment of a semiconductor device 103 in a section of a vertical cross-section. Semiconductor device 103 is similar to semiconductor device 102. However, only semiconductor region 5 of semiconductor device 103 is clamped during operation through narrow trench 20 to source potential $V_S$ and emitter potential $V_E$, respectively, applied to first metallization 10. Further, a fourth semiconductor region 4 is also provided next to deep trench 30 and conductive region 12. Accordingly, conductive regions 12, 12a may form floating gate electrodes, gate electrodes coupled through a not shown gate metallization or clamped gate electrodes which are clamped through not shown additional narrow trenches. Due to clamping semiconductor region 5, short circuit properties of semiconductor device 102 are typically improved compared to a similar spaced channel field effect device but without clamping the floating body between adjoining trenches.

Narrow trench 20 typically includes one polycrystalline semiconductor region 21 which forms a poly-diode 14 with clamped semiconductor region 5. In this embodiment, poly-diode 14 is formed between polycrystalline semiconductor region 21 and monocrystalline semiconductor region 5.

Figure 5:
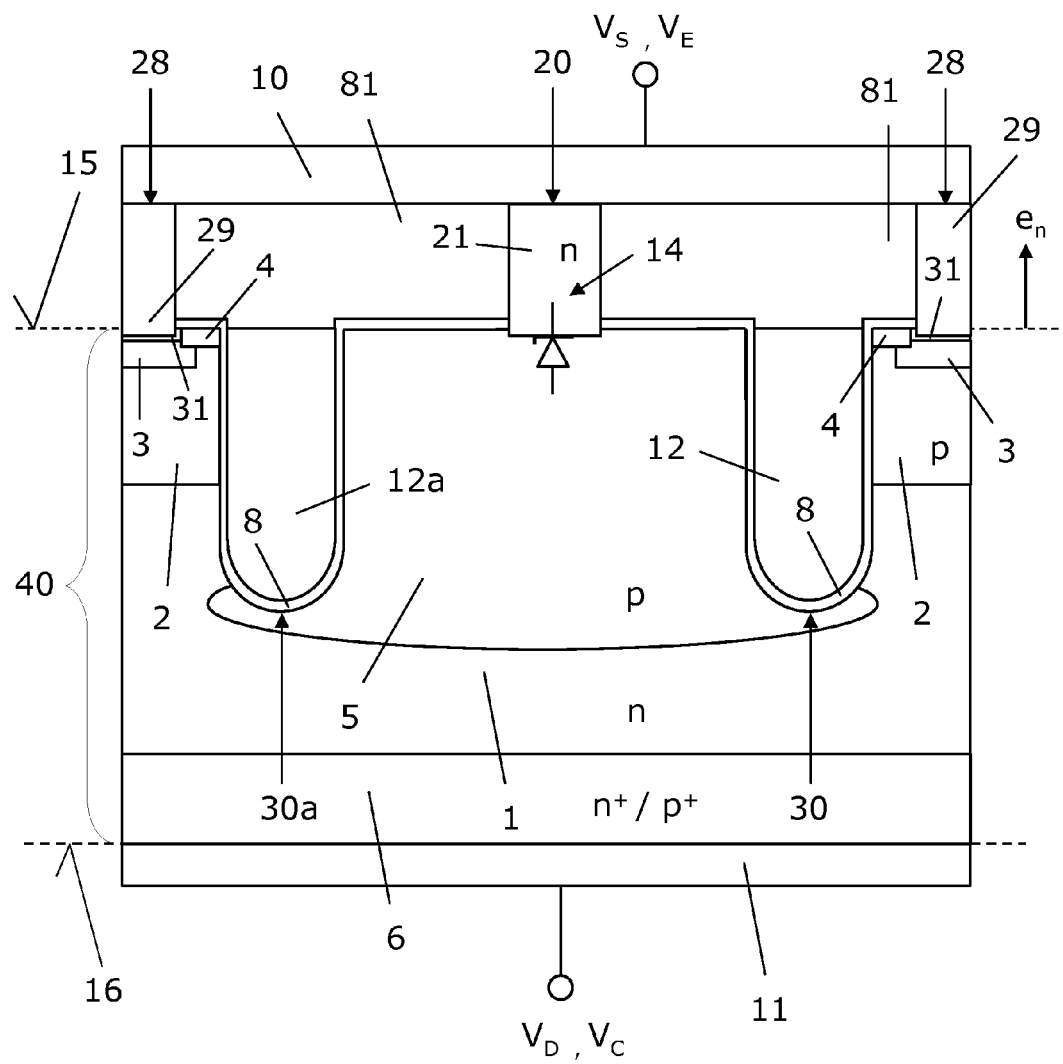
FIG. 5 schematically illustrates a vertical cross-section of a vertical semiconductor device according to one or more embodiments.

FIG. 5 illustrates an embodiment of a semiconductor device 104 in a section of a vertical cross-section. Semiconductor device 104 is similar to semiconductor device 103. However, semiconductor device 104 has no LOCOS-region 82. Accordingly, narrow trench 21 extends through intermediate dielectric layer 81, through portions of thin dielectric layer 8 which are arranged on main horizontal surface 15 and to main horizontal surface 15 or slightly below main horizontal surface 15 to form a poly-diode 14 between polycrystalline semiconductor region 21 and the monocrystalline clamped body region 5.

Figure 6:
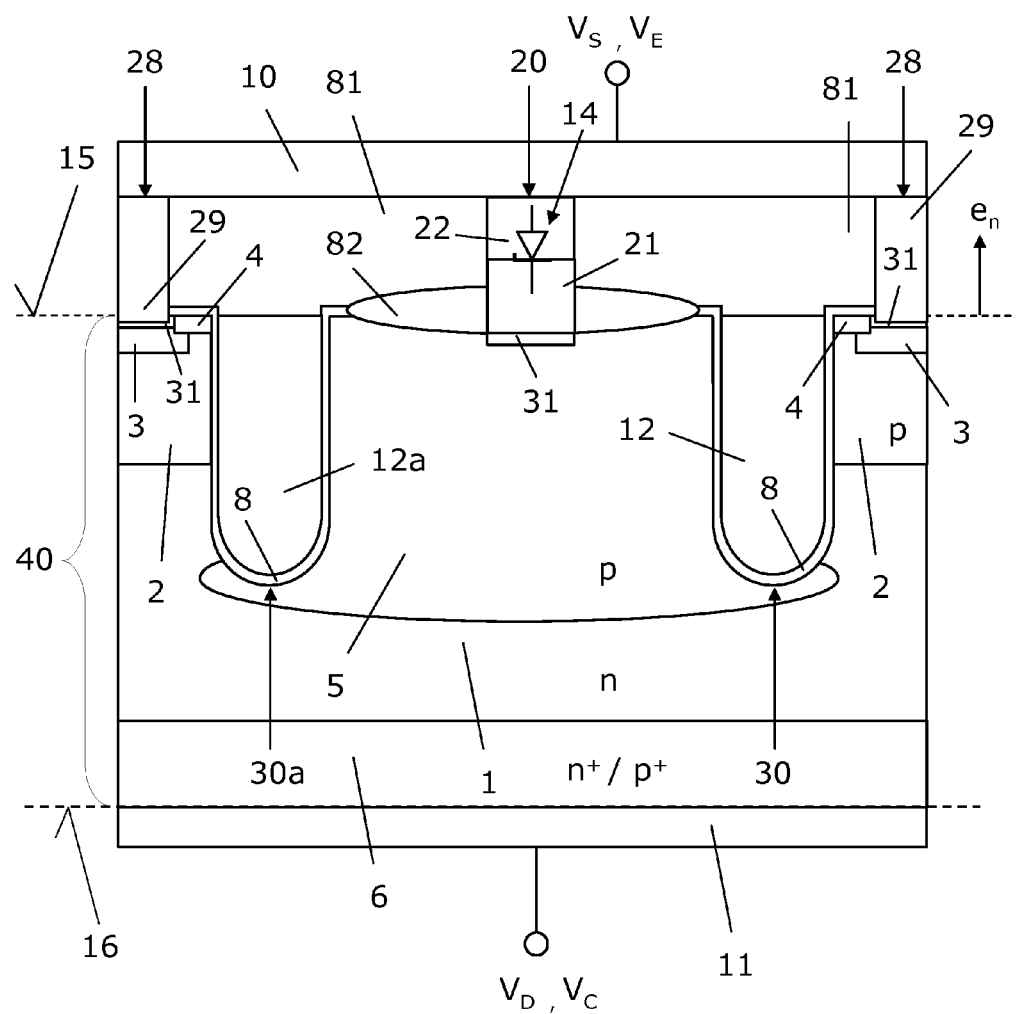
FIG. 6 schematically illustrates a vertical cross-section of a vertical semiconductor device according to one or more embodiments.

FIG. 6 illustrates an embodiment of a semiconductor device 105 in a section of a vertical cross-section. Semiconductor device 105 is similar to semiconductor device 103. However, poly-diode 14 is formed within narrow trench 20 between the two oppositely doped polycrystalline semiconductor regions 21 and 22. As the pn-junction between the two polycrystalline semiconductor regions 21 and 22 is arranged in narrow trench 20 which is horizontally surrounded by insulating material, high electric field strength, which may occur close to this pn-junction during operation, typically do not influence clamped body region 5. Accordingly, long-term stability and/or reliability of semiconductor device 105 may be improved. Further, a silicide layer or salicide (self-aligned silicide) layer 31 may be arranged between clamped semiconductor region 5 and polycrystalline semiconductor region 21. LOCOS-region 82 of semiconductor device 105 is only optional.

Figure 7:
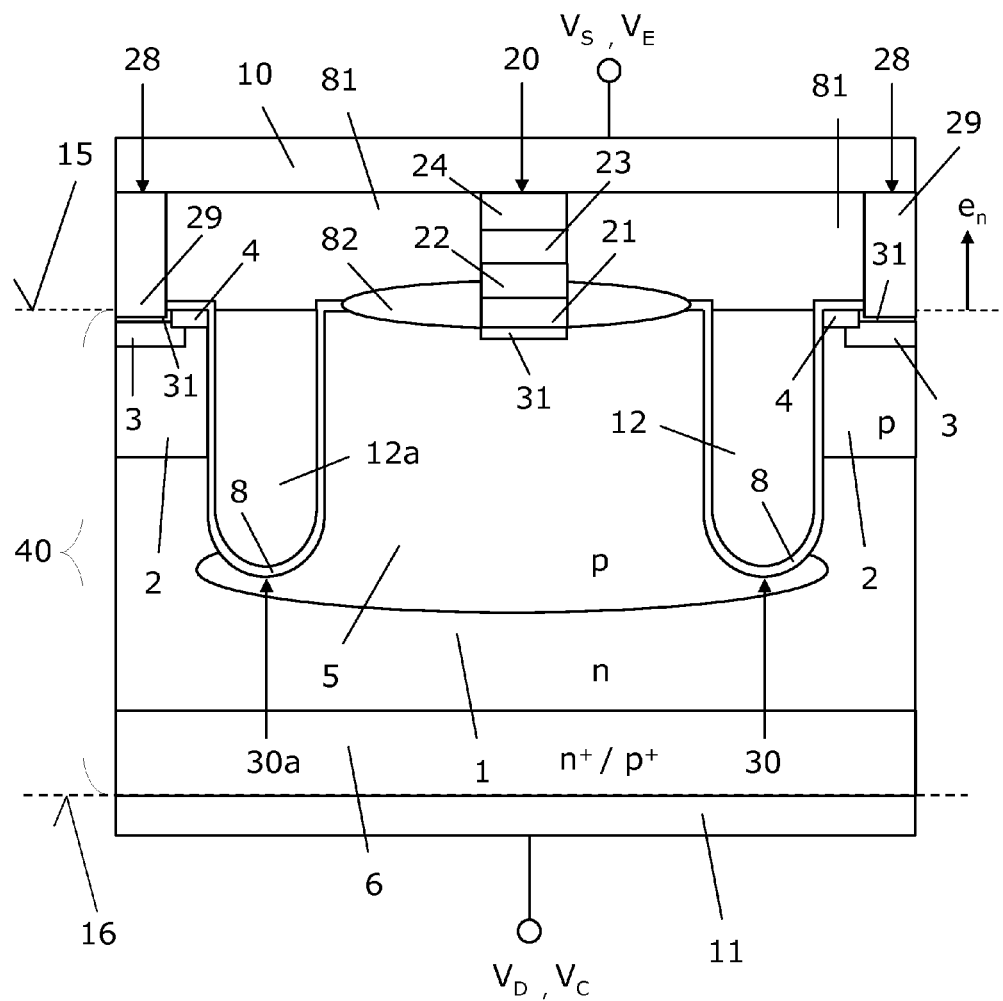
FIG. 7 schematically illustrates a vertical cross-section of a vertical semiconductor device according to one or more embodiments.

FIG. 7 illustrates an embodiment of a semiconductor device 106 in a section of a vertical cross-section. Semiconductor device 106 is similar to semiconductor device 105. However, narrow trench 20 includes a stack of polycrystalline semiconductor region 21 to 24. The conductivity type of polycrystalline semiconductor region 21 to 24 is typically alternating. Accordingly, a chain of poly-diodes is realized in narrow trench 20. In so doing, clamping voltage in both currents directions may be tailored as required by the application. For example, semiconductor region 5 may be clamped to equal positive and negative voltage fluctuations relative to first metallization 10. Two adjoining polycrystalline semiconductor regions, for example polycrystalline semiconductor regions 23 and 24, may however also be of the same conductivity type but with different doping concentration to adjust resistivity through narrow trench 20. Accordingly, a series connection of a resistor and a poly-diode or stack of poly-diodes is provided through narrow trench 20.

Silicide layer 31 between clamped semiconductor region 5 and polycrystalline semiconductor region 21 is only optional. For example, a further pn-junction may be formed between clamped semiconductor region 5 and polycrystalline semiconductor region 2 as part of the poly-diode chain. In another example, clamped semiconductor region 5 and polycrystalline semiconductor region 21 are of the same conductivity type without a silicide layer therebetween. The LOCOS-region 82 of semiconductor device 106 is optional.

Figure 8:
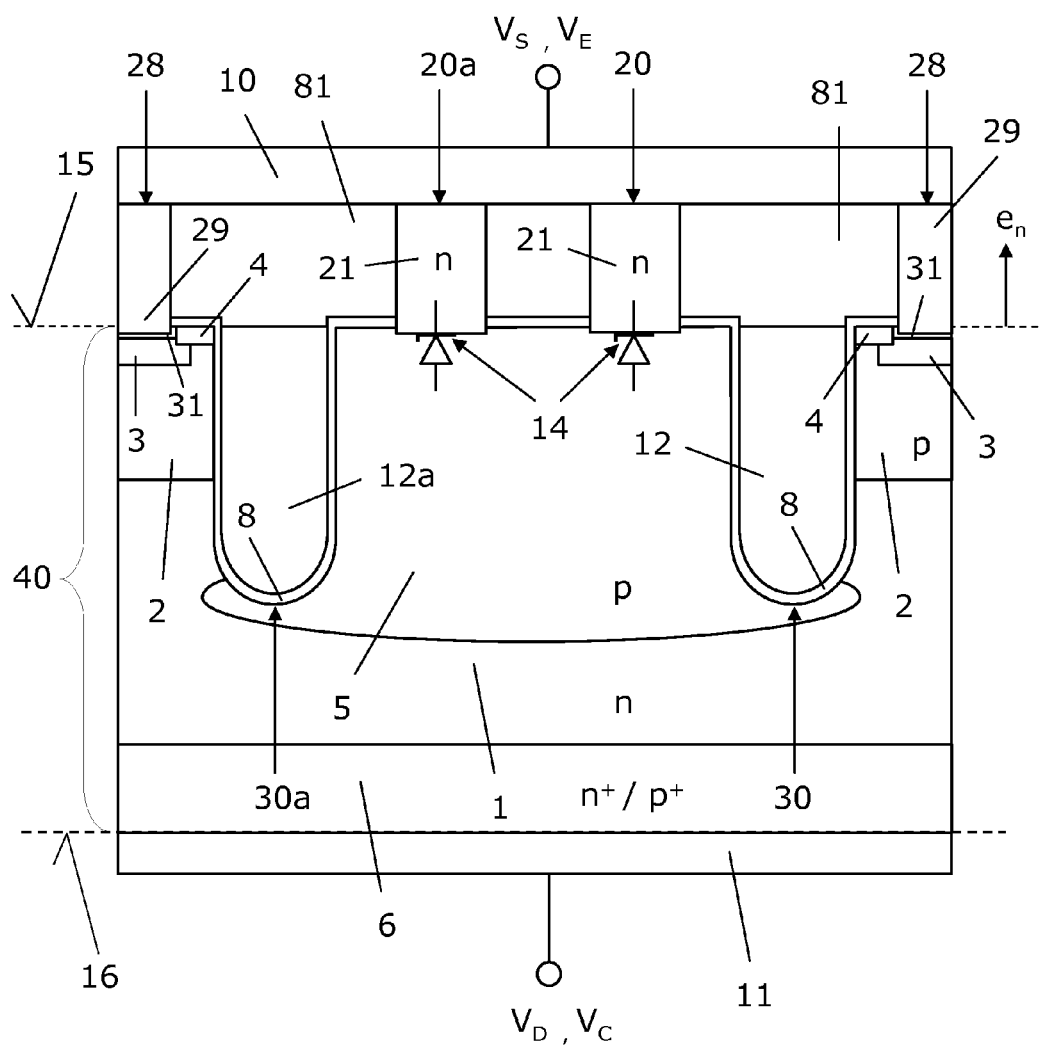
FIG. 8 schematically illustrates a vertical cross-section of a vertical semiconductor device according to one or more embodiments.

FIG. 8 illustrates an embodiment of a semiconductor device 107 in a section of a vertical cross-section. Semiconductor device 107 is similar to semiconductor device 104.

However, semiconductor region 5 is clamped via a plurality of narrow trenches 20, in this case two narrow trenches 20, 20a are shown, to first metallization 10. This typically allows a better coupling between clamped semiconductor region 5 and first metallization 10. Two or more trenches may be used to clamp a gate electrode to first metallization 10 or a gate metallization. Compared to one narrow trench but having a double horizontal extension, less material is required and thus costs may be saved during forming the polycrystalline semiconductor region 21. Furthermore, two trenches 20, 20a allow more freedom in tailoring the electronic properties of the coupling between semiconductor region 5 and first metallization 10 as equal or different electronic components may be provided through trenches 20, 20a. This is illustrated in the following FIGS. 9 and 10.

Figure 9:
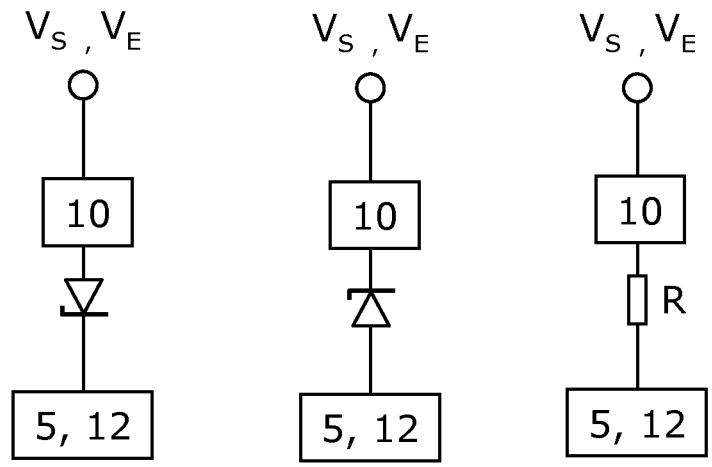
FIG. 9 schematically illustrates circuits which may be used in embodiments of vertical semiconductor devices.
Figure 9:
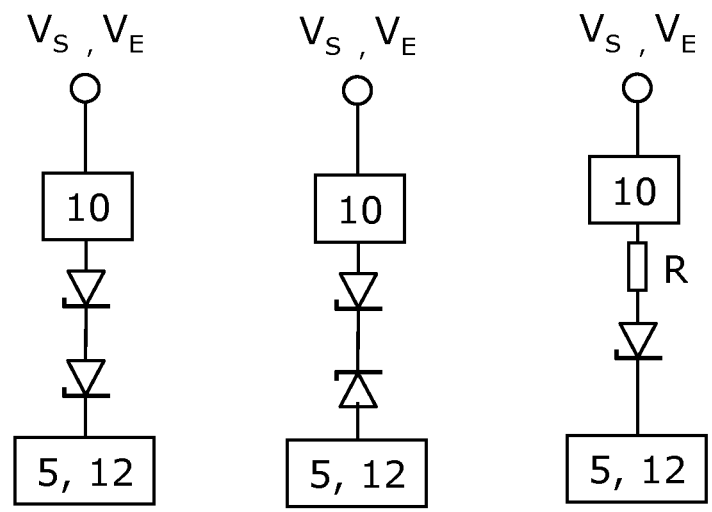

As illustrated in FIG. 9, a diode, a resistor R, a serial connection of two (or more) diodes and a serial connection of a resistor and one (ore more) diode(s) may be realized through one narrow trench and between first metallization 10 and semiconductor region 5 and/or conductive region 12.

Figure 10:
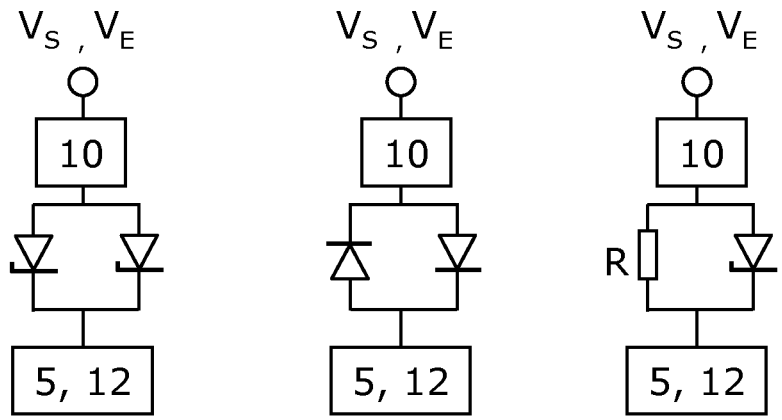
FIG. 10 schematically illustrates circuits which may be used in embodiments of vertical semiconductor devices.
Figure 10:
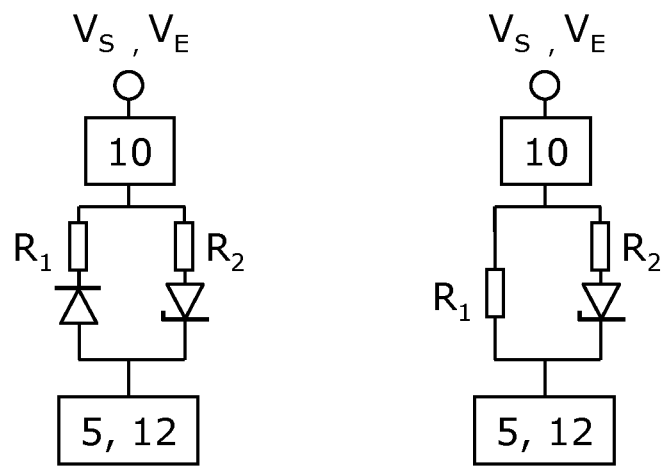

As illustrated in FIG. 10, parallel connections of elementary diodes (or diode chains) and resistors R, as well parallel connections of a serial connection of two (or more) diodes and a serial connection of a resistor and one (ore more) diode(s) may be realized through two narrow trench and between first metallization 10 and semiconductor region 5 and/or conductive region 12. The circuits of FIG. 10 represent only a few examples of the possible circuits.

Figure 11:
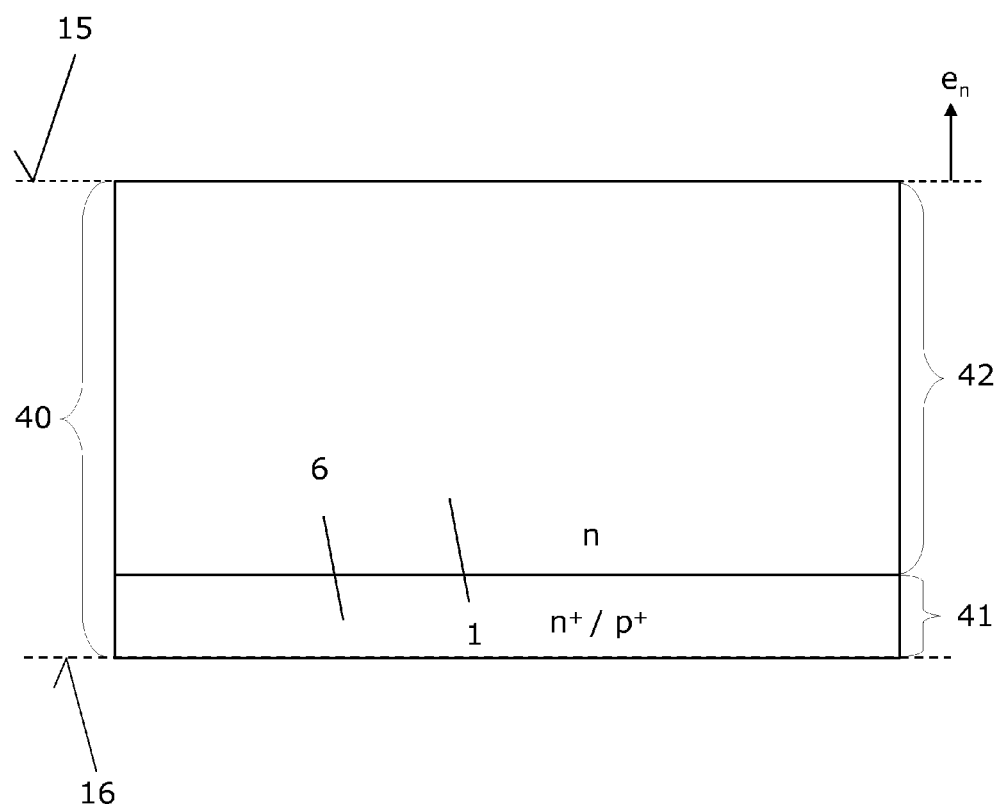
FIGS. 11-21 illustrate manufacturing processes according to one or more embodiments.

With respect to FIGS. 11 to 21 processes for forming a semiconductor device 101 according to several embodiments are illustrated in sections of vertical cross-sections. In a first process, a wafer or substrate 40 having a main horizontal surface 15 and a semiconductor layer 1 of a first conductivity type (n-type) is provided. As illustrated in FIG. 11, semiconductor layer 1 extends to main horizontal surface 15. Typically, a drift region 1 is later formed from lower parts of semiconductor layer 1. A heavily doped $n^+$-type or $p^+$-type contact layer 6 or sixth semiconductor region 6 may extend from semiconductor layer 1 to a back surface 16 arranged opposite to main horizontal surface 15 to later form an ohmic connection to a drain metallization and collector metallization, respectively. The normal direction $e_n$ of main horizontal surface 15 defines the vertical direction. Substrate 40 may be made of any suitable semiconductor material such as Si, Ge, GaN or SiC. The semiconductor substrate 40 can be a single bulk mono-crystalline material. It is also possible, that the semiconductor substrate 40 includes a bulk mono-crystalline material 41 and at least one epitaxial layer 42 formed thereon. Using epitaxial layers 42 provides more freedom in tailoring the background doping of the material since the doping concentration can be adjusted during deposition of the epitaxial layer or layers 42. Sixth semiconductor region 6 may be used as a substrate during manufacturing. When using a single bulk monocrystalline material 42, sixth semiconductor region 6 may also be implemented later e.g. after thinning of bulk material 42 to the appropriate thickness for device operation.

Figure 12:
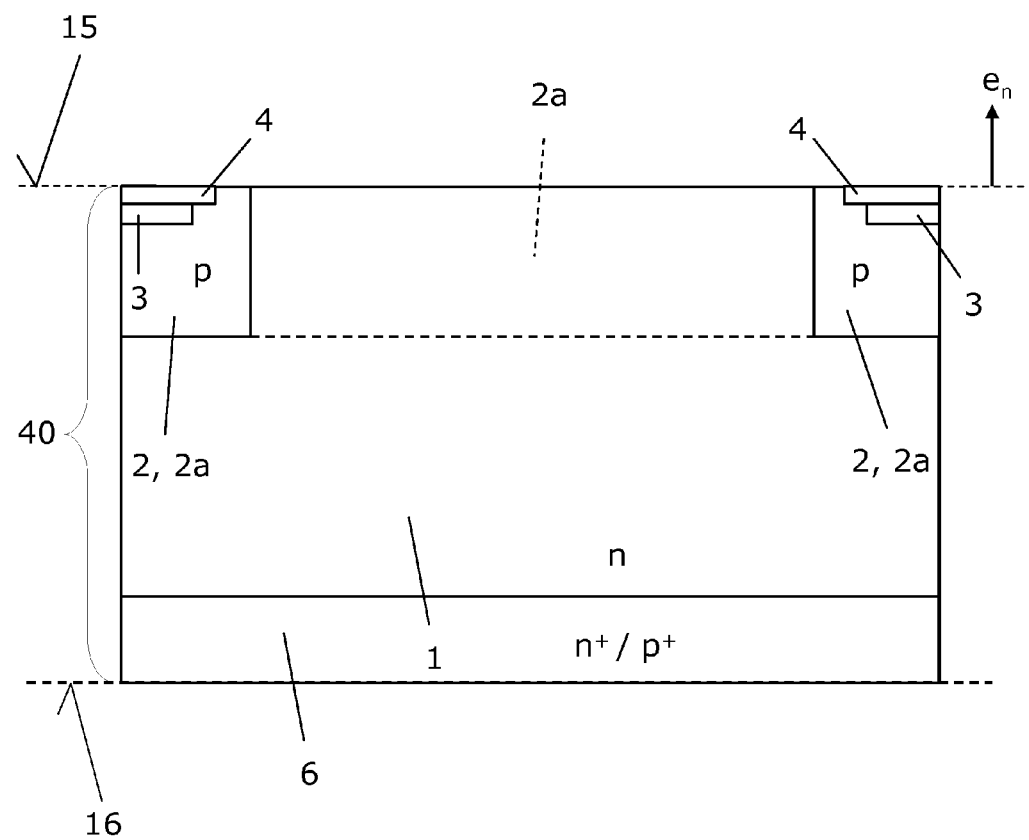

Thereafter, a structured p-type layer 2, $p^+$-type third semiconductor regions 3 and $n^+$-type fourth semiconductor regions 4 are formed in semiconductor body 40 such that pn-junctions between each of the two second semiconductor regions 2 and the first semiconductor region 1, and between each of the two second semiconductor regions 2 of structured p-type layer 2 and respective third semiconductor regions 3 are formed. At least parts of structured p-type layer 2 later form body regions 2. Accordingly, the pn-junctions between semiconductor region 1 and semiconductor region 2 typically form rectifying junctions of respective body diodes. The third semiconductor regions 3 adjoin respective body regions 2 and typically form body contact regions 3. At least parts of the fourth semiconductor regions 4 later form source regions 4 or emitter regions 4. Structured p-type layer 2, third semiconductor regions 3 and fourth semiconductor regions 4 are typically formed by implantation of suitable amounts of dopants at main horizontal surface 15 and subsequent drive-in processes. The resulting structure 101 is illustrated in FIG. 12.

Alternatively, an unstructured p-type layer 2a may be formed instead of structured layer 2. This is illustrated by the dashed line in FIG. 12. Layer 2a may be formed as an epitaxial layer 2a or by implantation and a subsequent drive-in step.

Third semiconductor regions 3 of semiconductor device 101 are spaced apart from main horizontal surface 15 and are later contacted via shallow trenches. In other embodiments, third semiconductor regions 3 extend to main horizontal surface 15. Accordingly, third semiconductor regions 3 and fourth semiconductor regions 4 may later by contacted by planar contacts.

Figure 13:
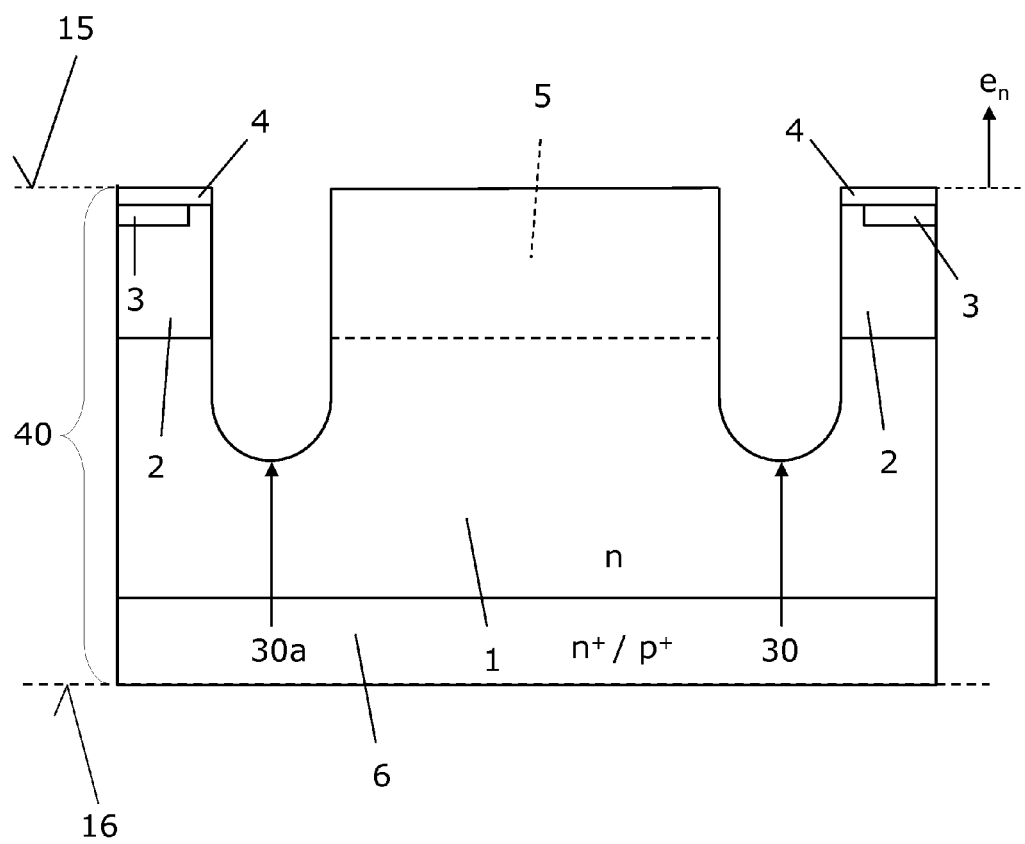

After forming structured p-type layer 2, $p^+$-type third semiconductor regions 3 and $n^+$-type fourth semiconductor regions 4, deep trenches 30, 30a are etched from main horizontal surface 15 into semiconductor body 40 such that each of the deep trenches 30, 30a adjoins first semiconductor region 1, a respective second semiconductor region 2 and a respective fourth semiconductor region 4 and such that the deep trenches 30, 30a extend vertically below the pn-junction of the body diode. The resulting structure 101 is illustrated in FIG. 13. The deep trenches 30, 30a may also be formed prior to forming layer 2a, and/or prior to forming third semiconductor regions 3 and/or prior to forming fourth semiconductor regions 4.

When an unstructured p-type layer 2a has been formed instead of structured layer 2, a fifth semiconductor region 5 is additionally formed by etching deep trenches 30, 30a. Typically, fifth semiconductor region 5 later forms a floating or a clamped body region 5. The doping concentration and/or vertical extension of fifth semiconductor region 5 may be adjusted by further implantation and drive-in processes. Fifth semiconductor region 5 and first semiconductor region 1 also form a pn-junction. Fifth semiconductor region may be formed earlier in the process e.g. using ion implantation and diffusion techniques, e.g. even before forming trenches 30, 30a.

Figure 14:
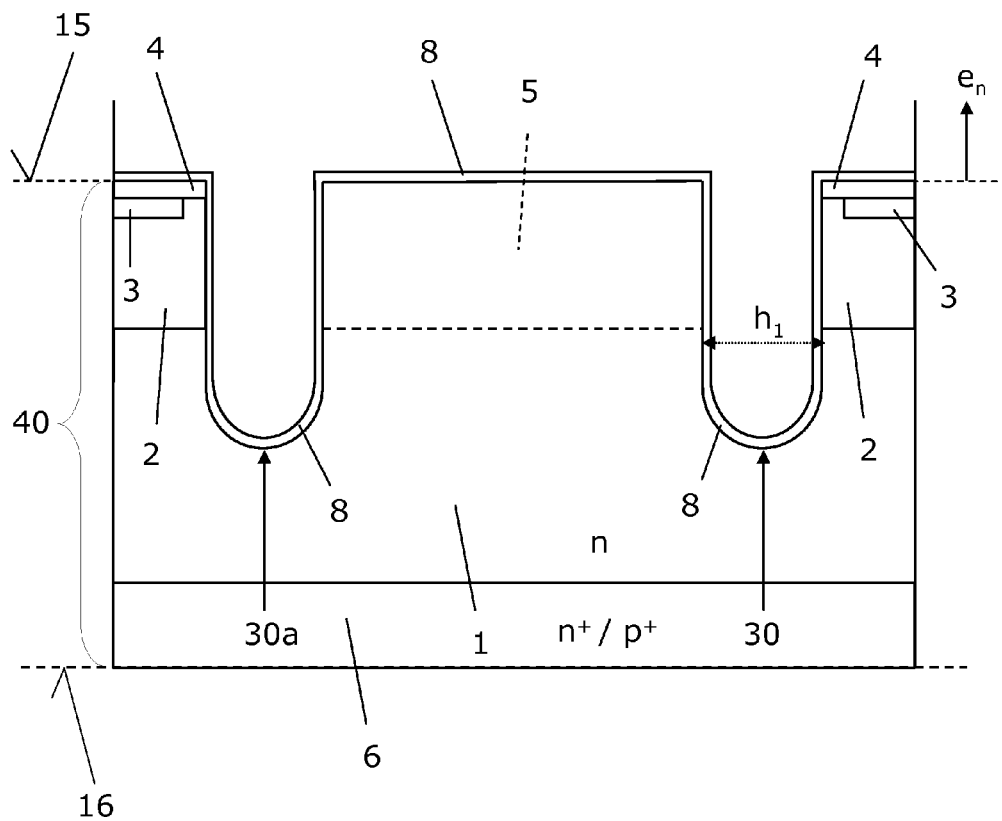

Thereafter, a thin dielectric layer 8 is formed at least on the walls of the deep trenches 30, 30a. Typically, thin dielectric layer 8 later forms a gate dielectric layer 8. As illustrated in FIG. 14, thin dielectric layer typically also covers main horizontal surface 15. Thin dielectric layer 8 may be formed in a CVD (chemical vapor deposition) process or as a thermal oxide or a combination of both. Deep trench 30 has, in the shown vertical cross-section, a first maximum horizontal extension $h_1$, which is in the following also referred to a further horizontal extension $h_1$. First maximum horizontal extension $h_1$ is typically in a range of about 0.2 μm to about 5 μm more typically in a range of about 0.7 μm to about 3 μm. Deep trench 30a has typically the same geometry as deep trench 30, at least in the shown cross-section.

Figure 15:
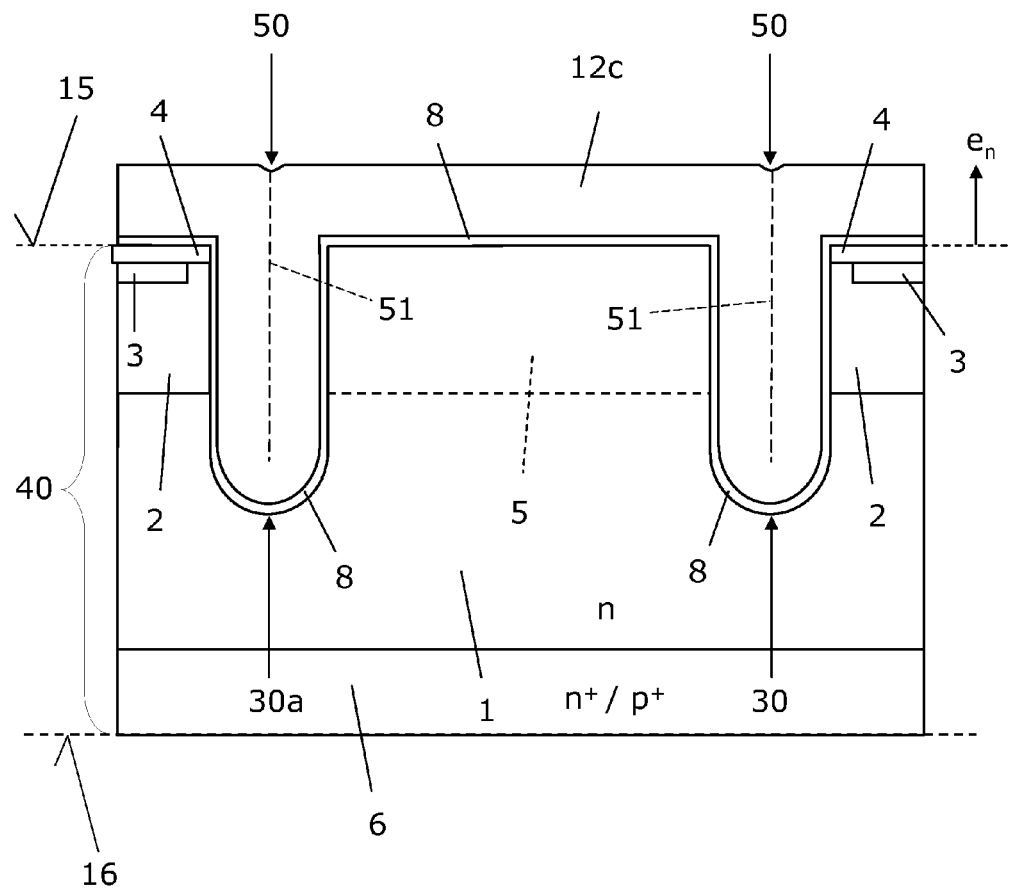

Thereafter, a conductive layer 12c, for example a highly doped poly-Si layer 12c, is substantially conformly deposited on main horizontal surface 15. Depending on process conditions during deposition, small dips 50 may be formed above each of the deep trenches 30, 30a and small voids or a pearl chain 51 of small voids may be formed in each of the deep trenches 30, 30a. The resulting structure 101 is illustrated in FIG. 15. With adjusted deposition conditions only a seamline 51 may be formed instead of the pearl chain 51. Under further optimized conditions e.g. regarding the angle of the trench walls, forming of seamlines may be avoided.

Figure 16:
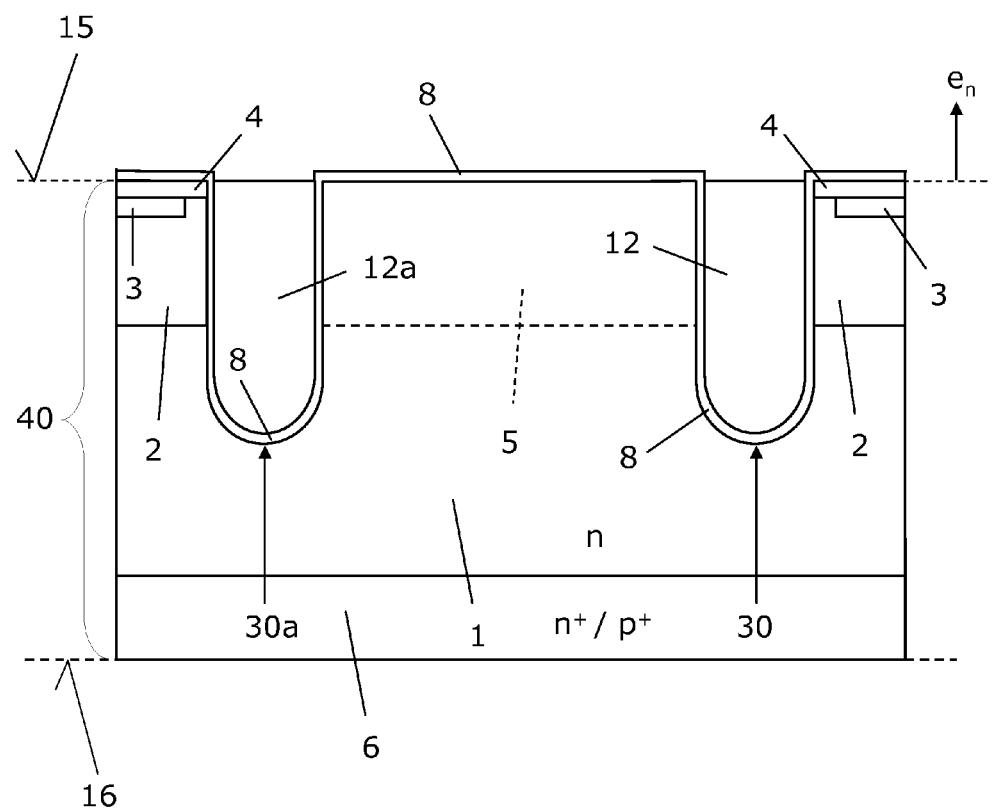

Thereafter, conductive layer 12c is etched back to form insulated conductive regions 12 and 12a in the trenches 30 and 30a, respectively. The resulting structure 101 is illustrated in FIG. 16. For sake of clarity, any dips, pearl chains or seamlines are not shown in FIG. 16 and the following figures. Alternatively or in addition, insulated conductive regions 12 and 12a are formed in a CMP (chemical-mechanical planarization or chemical-mechanical polishing) process, which removes any dips formed during depositing conductive layer 12c. Etch back may be performed using a mask and leaving electrical connections between conductive regions 12, 12a and/or an external connection of conductive regions 12 and/or 12a. This is not illustrated in FIG. 16.

The process explained with respect to FIGS. 11 to 16 may also be described as a process of providing a semiconductor body 40 having a main horizontal surface 15 and a gate electrode structure which is arranged in a deep trench 30. The deep trench 30 includes, in a vertical cross-section a first horizontal extension $h_1$. The gate electrode structure has a gate electrode 12 which is insulated from the semiconductor body 40. An upper surface of the gate electrode 12 is exposed.

Figure 17:
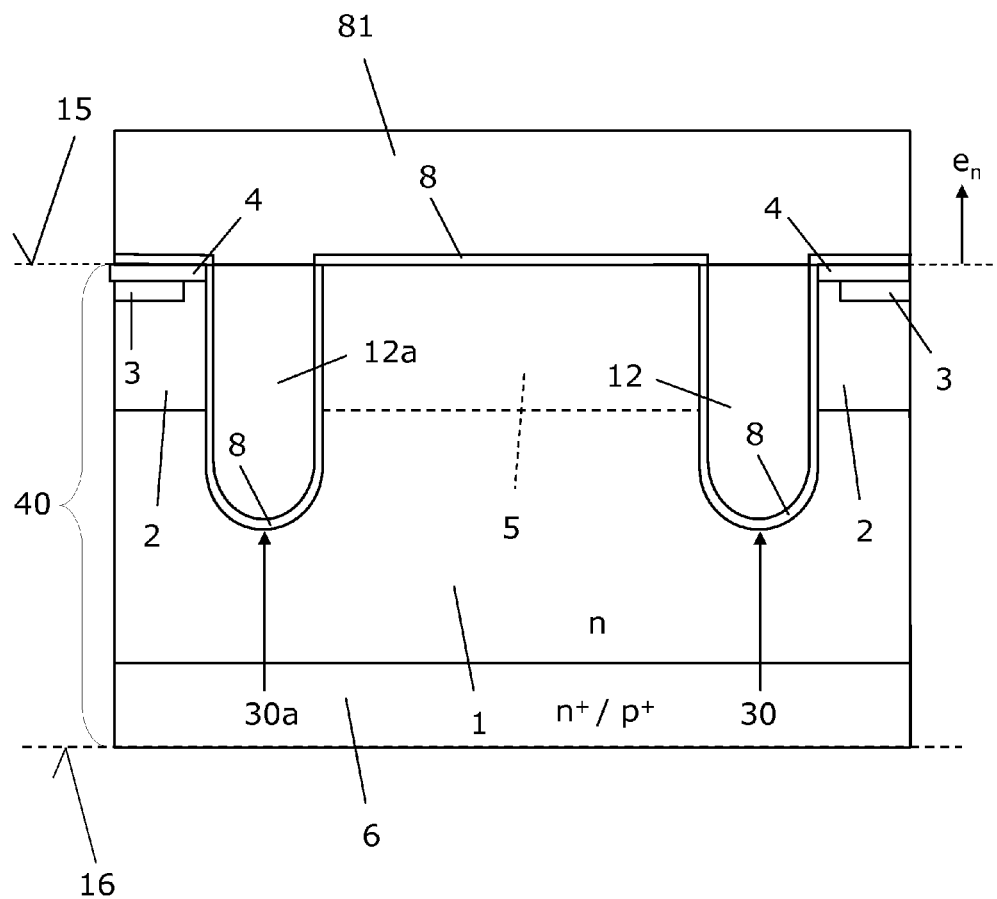
Figure 18:
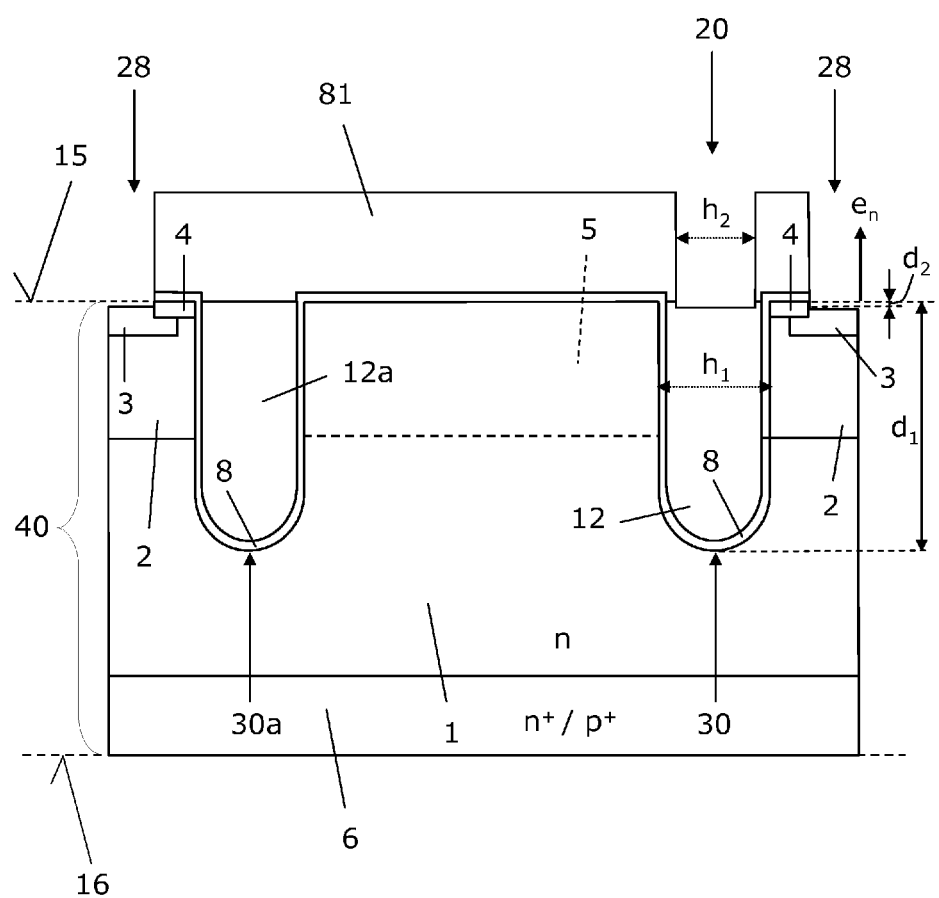

Thereafter, an insulating layer 81 or intermediate dielectric layer 81 is formed on main horizontal surface 15 such that the insulating layer covers the conductive regions 12, 12a. The resulting semiconductor device 101 is illustrated in FIG. 17. Insulating layer 81 is typically formed in a CVD process and has a thickness of about 0.2 μm to about 3 μm.

Thereafter, a narrow trench 20 is etched through the insulating layer 81 at least to the semiconductor body 40 and main horizontal surface 15, respectively. In the exemplary embodiment illustrated in FIG. 18, conductive region 12 is exposed by etching narrow trench 20.

According to an embodiment, narrow trench 20 has, in the shown vertical cross-section, a second horizontal extension $h_2$ which is smaller than the first horizontal extension $h_1$. Typically, second horizontal extension $h_2$ is in a range of about 0.1 μm to about 2.5 μm, more typically in a range of about 0.3 μm to about 1.5 μm.

According to an embodiment, deep trench 30 extends to a first vertical depth $d_1$ below main horizontal surface 15, which typically ranges from about 0.5 μm to about 10 μm and narrow trench 20 extends to a second vertical depth $d_2$ which is smaller than the first vertical depth $d_1$. Typically, second vertical depth $d_2$ is smaller than about 500 nm, more typically smaller than 300 nm. Narrow trench 20 is typically formed by dry-etching using e.g. a plasma containing fluorine ions. Speed of dry etching depends on material to be etched. Slightly etching into conductive region 12 is uncritical. Accordingly, a wide processing window is provided.

According to an embodiment, further narrow trenches 28 are formed during etching narrow trench 20 such that the further narrow trenches 28 extend at least to the semiconductor body 40. In the exemplary embodiment illustrated in FIG. 18, third semiconductor regions 3 are exposed by forming narrow trenches 28. Further, fourth semiconductor regions 4 may be exposed by forming narrow trenches 28. Accordingly, second semiconductor regions 2, third semiconductor regions 3 and fourth semiconductor regions 4 may be later contacted through further narrow trenches 28. In another embodiment, contact to third semiconductor region 3 and fourth semiconductor region 4 may be provided by a lateral limitation of third semiconductor region 3 and fourth semiconductor region 4 without extending narrow trenches 28 into semiconductor body 40.

According to an embodiment, a silicide layer 31 is formed as silicide 31 by depositing a transition metal layer, for example a tungsten layer or a titanium layer or a tantalum layer or a cobalt layer, without an additional mask and a thermal process. In so doing, a low ohmic contact to body region 2 and source or emitter region 4 as well as conductive region 12 is prepared.

Figure 19:
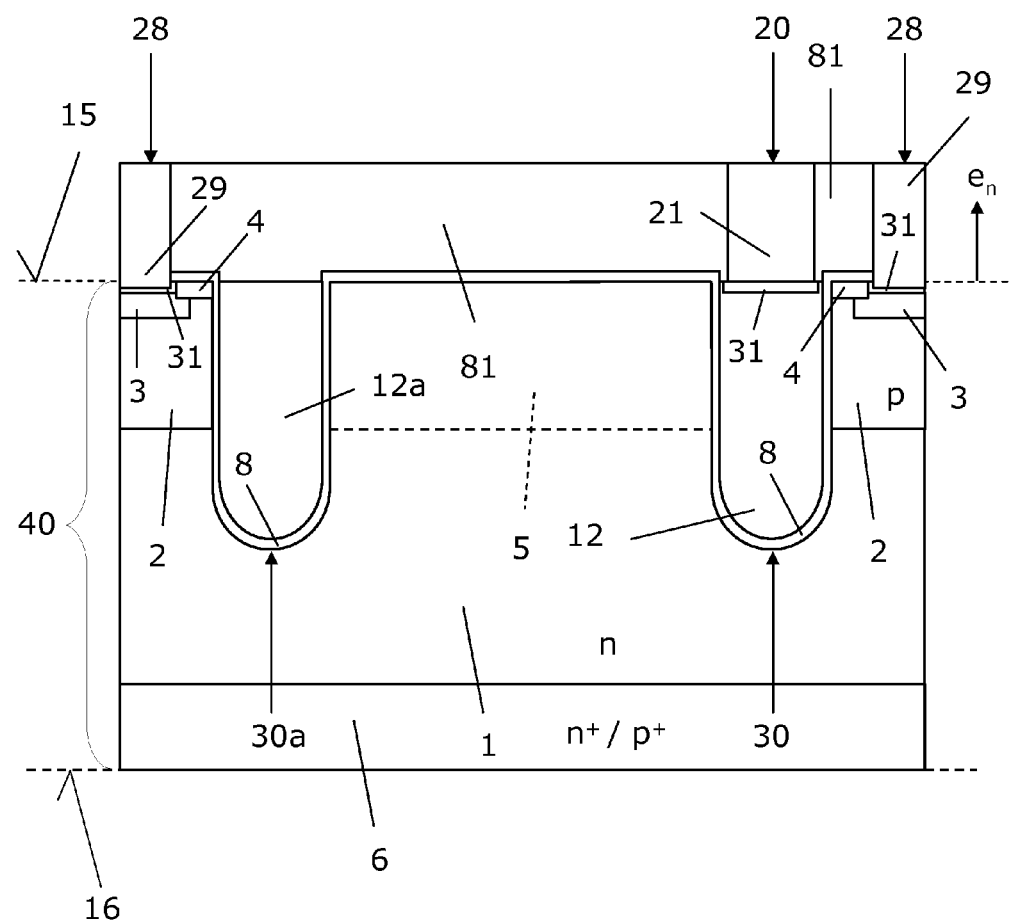

Thereafter, a polycrystalline semiconductor layer is deposited in a similar CVD-process as explained with reference to FIG. 15. Depositing is typically carried out such that the deposited polycrystalline semiconductor layer has a minimum vertical thickness of at least the half of the second horizontal extension $h_2$. This means that minimum vertical thickness of the deposited polycrystalline semiconductor layer is equal to or larger than 50% of the horizontal extension $h_2$ of narrow trench 20 in the vertical cross-section. In other words, the deposited polycrystalline semiconductor layer is typically formed as a conformal layer such that the narrow trench 20 and the further narrow trenches 28 are at least completely filled. Depending on process conditions, small dips, small voids or pearl chains of small voids or seamlines may be formed during depositing the conformal layer similar as explained with reference to FIG. 15 for filling the deep trenches with polycrystalline silicon. These structures may be detectable in the finally formed device. For sake of clarity, these structures are however not shown. Thereafter, the deposited polycrystalline semiconductor layer is maskless back-etched and/or a CMP process is carried out to form a polycrystalline semiconductor region 21 in narrow trench 20 and a polycrystalline semiconductor region 29 in each of the optional further narrow trenches 28. The resulting structure 101 is illustrated in FIG. 19. Polycrystalline semiconductor regions 21 and 29 may be deposited as doped polycrystalline semiconductor regions. Alternatively or in addition, doping of polycrystalline semiconductor regions 21 and 29 may be achieved by implantation of suitable amounts of dopants and subsequent drive-in processes.

Figure 20:
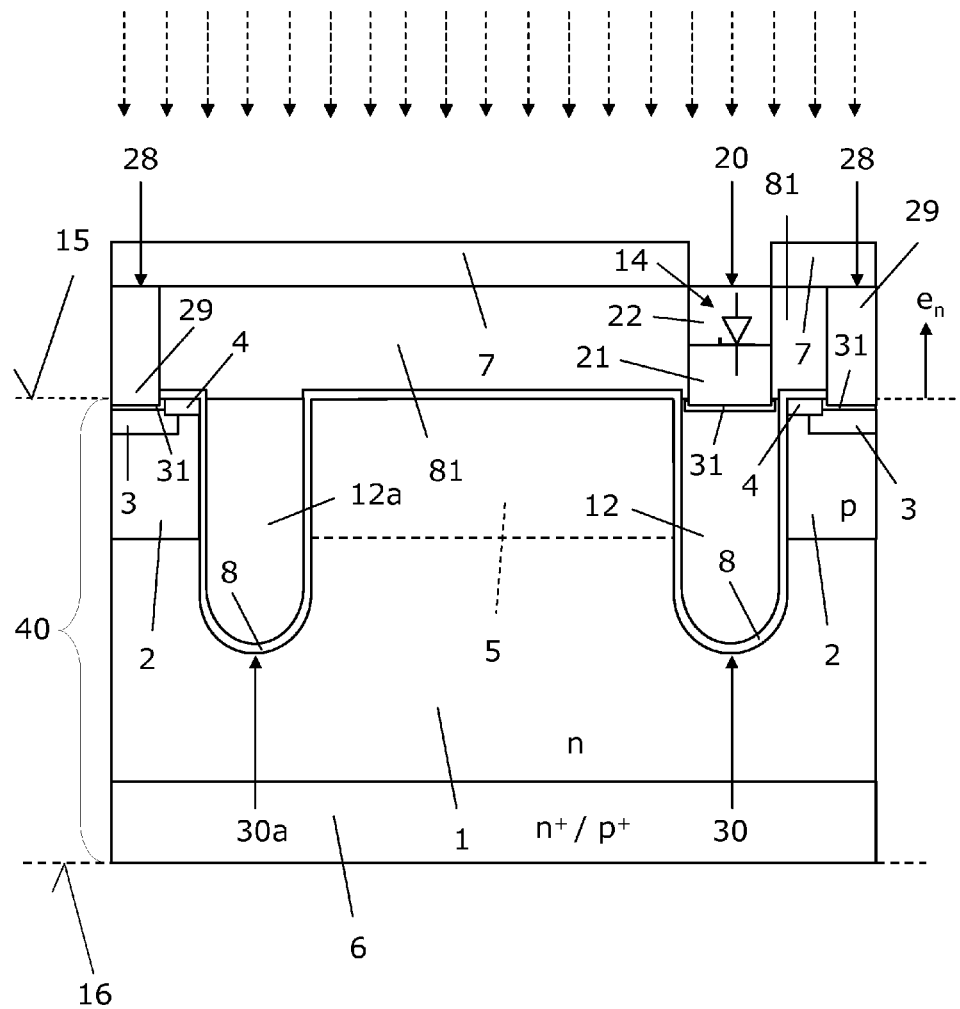

The latter process is illustrated in FIG. 20 with respect to forming a poly-diode 14 in narrow trench 20. In the exemplary embodiment illustrated in FIG. 20, polycrystalline semiconductor regions 21 and 29 are n-type. Through a mask 7, phosphorus ions or arsenic ions are implanted in an upper portion of narrow trench 20. This is illustrated by the dashed arrows. After a subsequent thermal process, a horizontally extending pn-junction is formed between a lower polycrystalline semiconductor region 21 and an upper polycrystalline semiconductor region 22. Accordingly, a vertical poly-diode 14 is formed in narrow trench 20. This structure may also be obtained by subsequently depositing and back-etching of p-type and/or n-type polycrystalline semiconductor material, respectively. Typically, polycrystalline semiconductor regions 21, 22 and 29 are formed as polycrystalline silicon semiconductor regions.

According to an embodiment, doping concentrations of the n-type polycrystalline semiconductor region 21 and the p-type polycrystalline semiconductor region 22 are chosen such that poly-diode 14 is formed as a Zener-diode.

Figure 21:
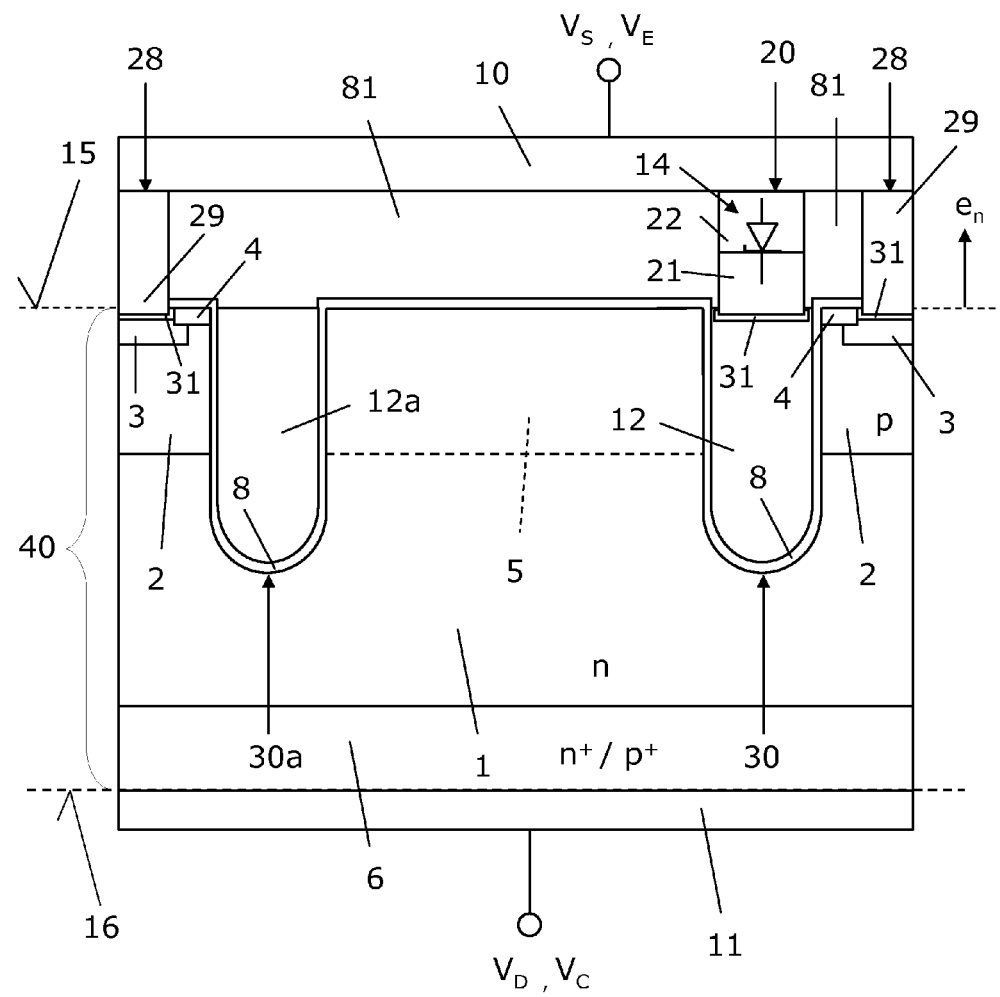

Thereafter, a first metallization 10 is deposited on insulating layer 81 and a second metallization 11 is formed on the back-side 16. The resulting structure 101 is illustrated in FIG. 21 and may, depending on conductivity type of sixth semiconductor region 6, be operated as a MOSFET with clamped gate electrode 12 or an IGBT with clamped gate electrode 12.

Figure 22:
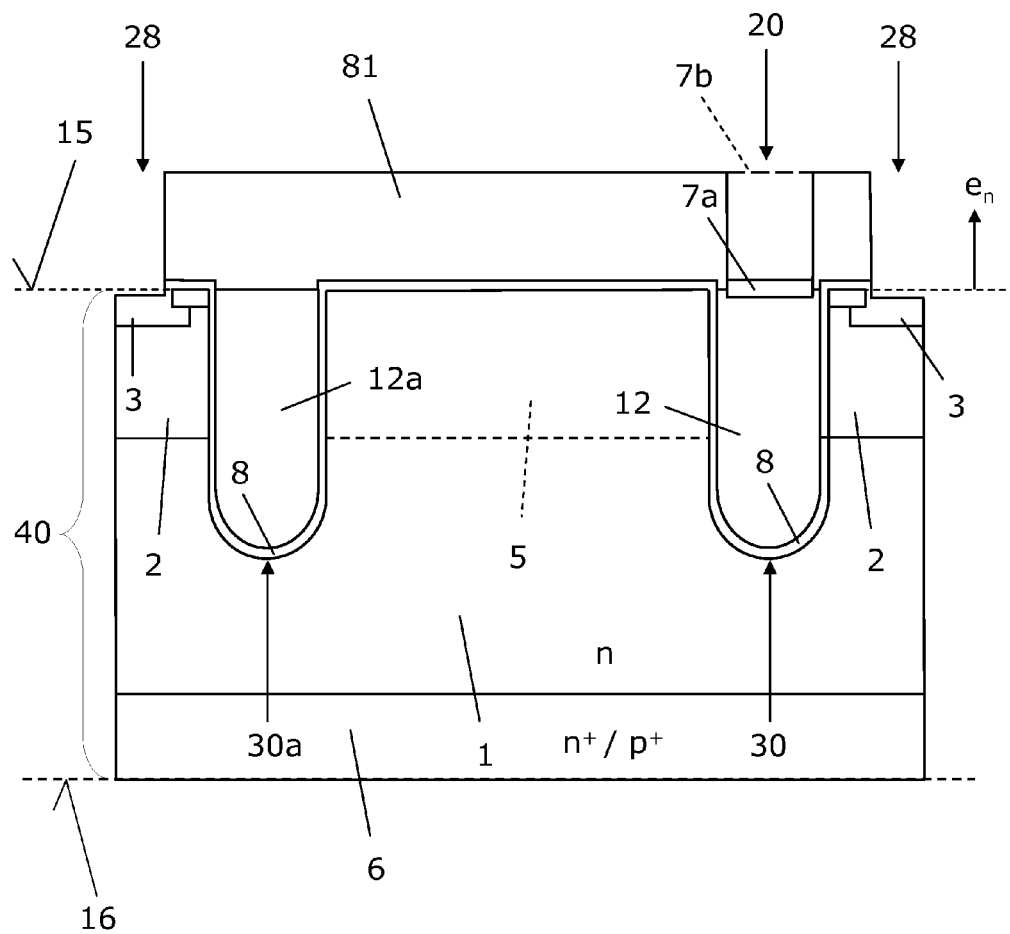
FIGS. 22 and 23 illustrate manufacturing processes according to one or more embodiments.
Figure 23:
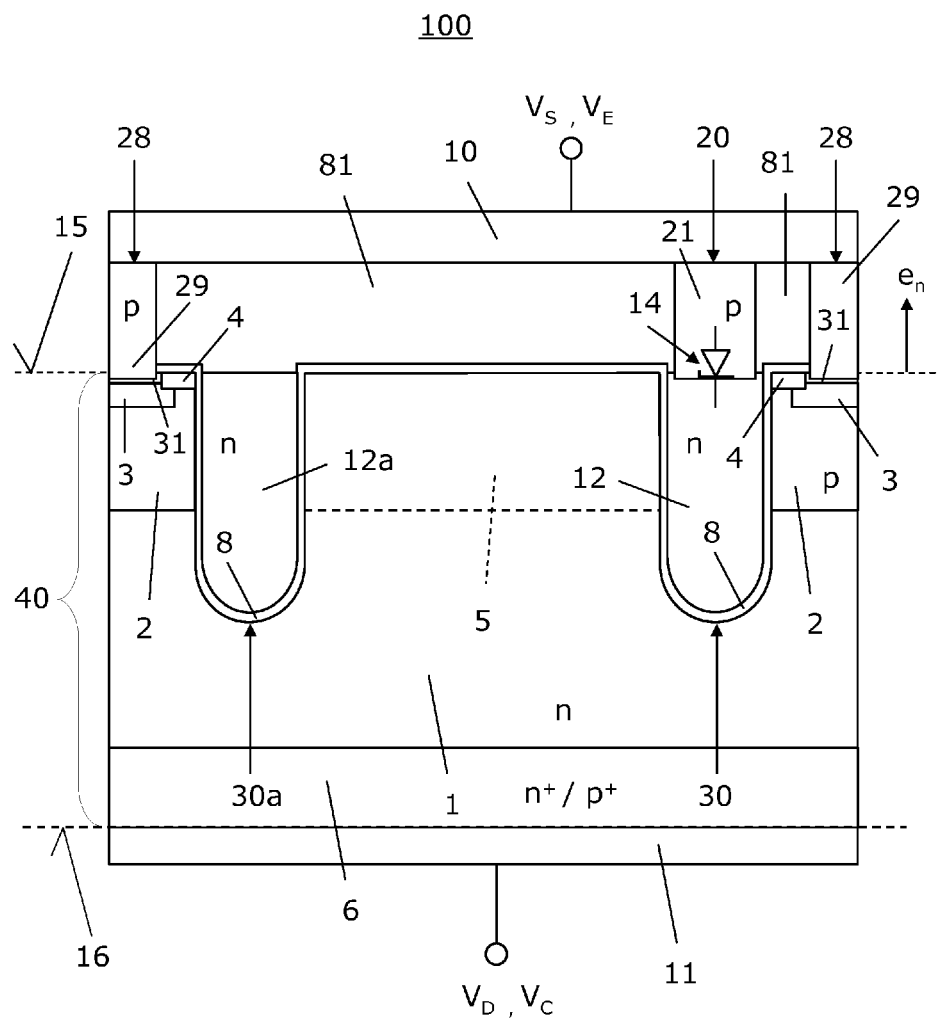

With respect to FIGS. 22 and 23 further processes for forming a semiconductor device 100 according to several embodiments are illustrated in sections of vertical cross-sections. The first processes to form semiconductor device 100 are similar as explained for semiconductor device 101 with reference to FIGS. 11 to 18. Thereafter, narrow trench 20 is masked with a dielectric layer 7a, for example a silicon oxide layer 7a, or filled with a mask 7b as indicated by the dashed line 7b. For example, silicon oxide layer 7a may be formed by thermal oxidation in a temperature range from about 800° C. to about 1000° C. and subsequent back-etching. This is because the growth rate of silicon oxide is about two to three times higher on poly-silicon of conductive region 12 compared to the growth rate of silicon oxide on monocrystalline silicon of third semiconductor region 3. The resulting semiconductor device 100 is illustrated in FIG. 22.

Thereafter, a silicide layers 31 are formed in the further trenches and dielectric layer 7a and mask 7b, respectively, is removed. Thereafter, p-type polycrystalline semiconductor regions 21 and 29 are formed in narrow trench 20 and further narrow trenches 28, respectively, similar as explained with reference to FIG. 19. Accordingly, a poly-diode 14 is formed between polycrystalline semiconductor region 21 and conductive region 12.

Thereafter, a first metallization 10 in contact with the third semiconductor regions 3 and the fourth semiconductor regions 4 as well as a second metallization 11 in contact with the sixth semiconductor region 6 are formed. The resulting semiconductor device 101 is illustrated in FIG. 23. Semiconductor device 100 may be operated as a MOSFET with clamped gate electrode 12 and an IGBT with clamped gate electrode 12, respectively.

In other words, semiconductor devices 100 and 101 are formed such that a current path with a rectifying junction is formed through a respective narrow trench 20 and between the first metallization 10 and the conductive region 12. Accordingly, conductive region 12 forms a clamped gate electrode 12.

Figure 24:
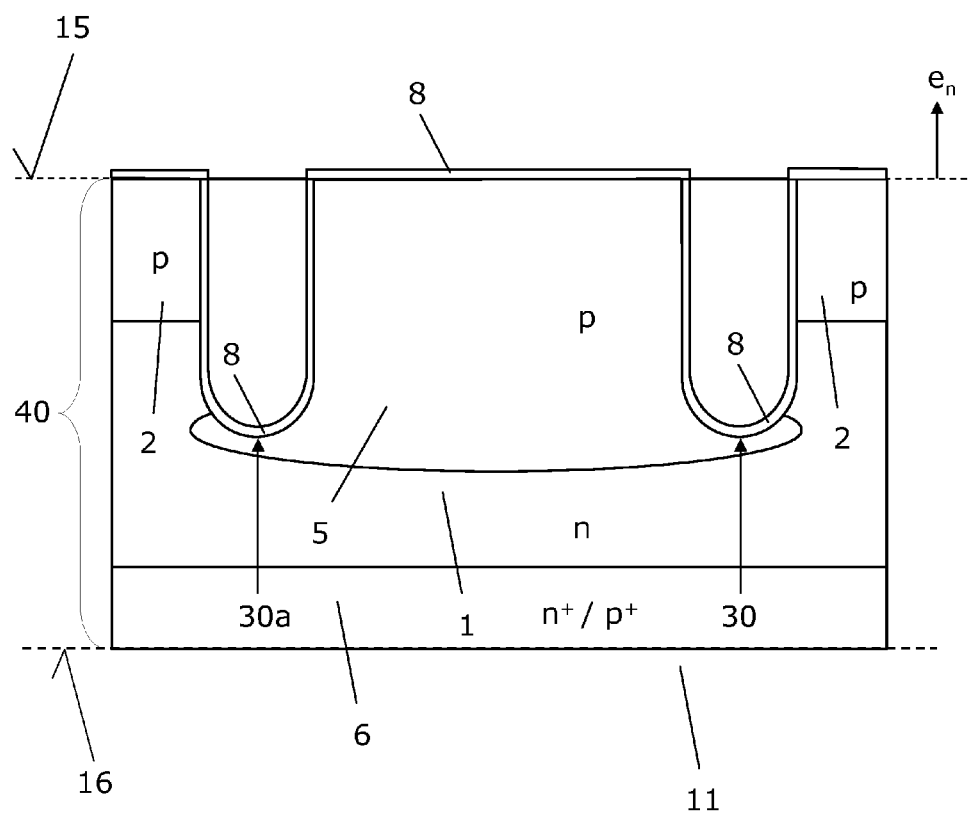
FIGS. 24-28 illustrate manufacturing processes according to one or more embodiments.

With respect to FIGS. 24 to 28 a further method for forming a semiconductor device 102 according to several embodiments are illustrated in sections of vertical cross-sections. The first processes to form semiconductor device 102 are similar as explained for semiconductor device 101 with reference to FIGS. 11 to 16. However, instead of forming third and fourth semiconductor regions 3, 4, a fifth semiconductor region 5 has been formed in these processes, for example by implantation and diffusion. Fifth semiconductor region 5 typically extends vertically below the deep trenches 30, 30a. The resulting semiconductor device 102 is illustrated in FIG. 24.

Figure 25:
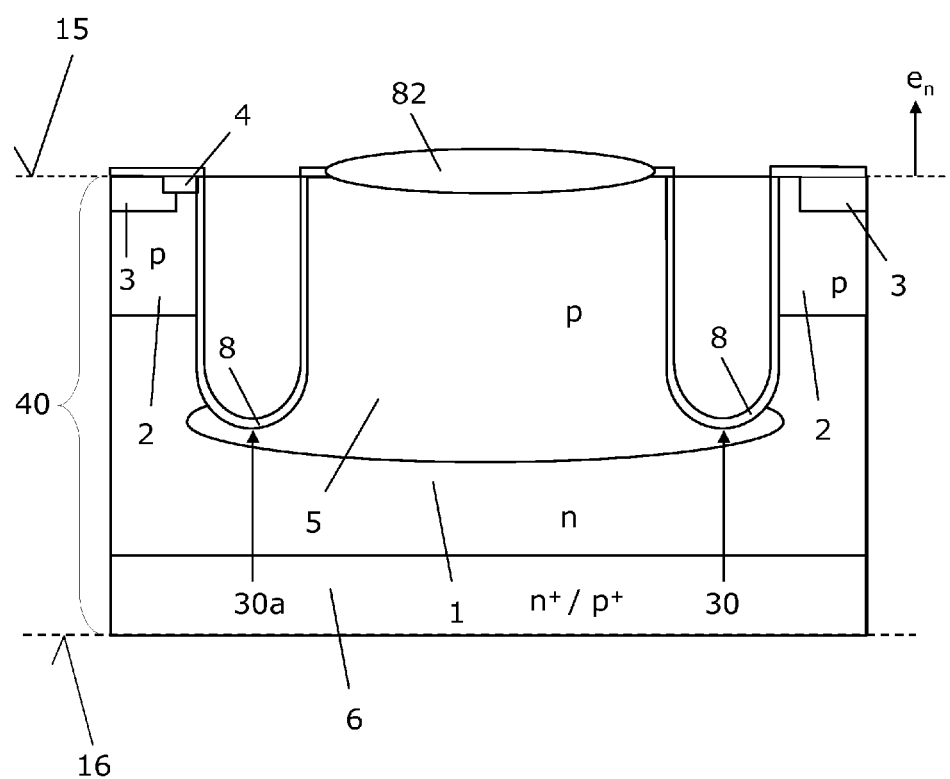

Thereafter, a LOCOS-region 82 is formed horizontally between the two deep trenches 30 and 30a. Subsequently, p$^+$-type third semiconductor regions 3 are formed in the second semiconductor regions 2 and a n$^+$-type fourth semiconductor region 4 is formed in the second semiconductor region 2 next to deep trench 30, for example by implantation and diffusion. The resulting semiconductor device 102 is illustrated in FIG. 25. LOCOS-region 82 extends vertically from above thin dielectric layer 8 into semiconductor body 40. During forming LOCOS-region 82, thermal processes are performed. Accordingly, second and fifth semiconductor regions 2 and 5 may further grow by out diffusing of dopants. This is typically taken into account but not illustrated in FIGS. 24 and 25. In other embodiments, LOCOS-region 82 is formed prior to forming second and/or third and/or fourth and/or fifth semiconductor regions 2, 3, 4 and 5. Accordingly, further grow of the respective regions is avoided. LOCOS-region 82 may even be formed prior to forming deep trenches 30, 30a.

Thereafter, an intermediate dielectric layer 81 is formed on main horizontal surface 15, for example in a CVD process. A thin trench 20 and optional further thin trenches 28 are etched through intermediate dielectric layer 81 to expose semiconductor body 40. These processes are similar as explained for semiconductor device 101 with reference to FIGS. 17 and 18. However, thin trench 20 is also etched through LOCOS-region 82 and fifth semiconductor region 5 is also exposed.

Figure 26:
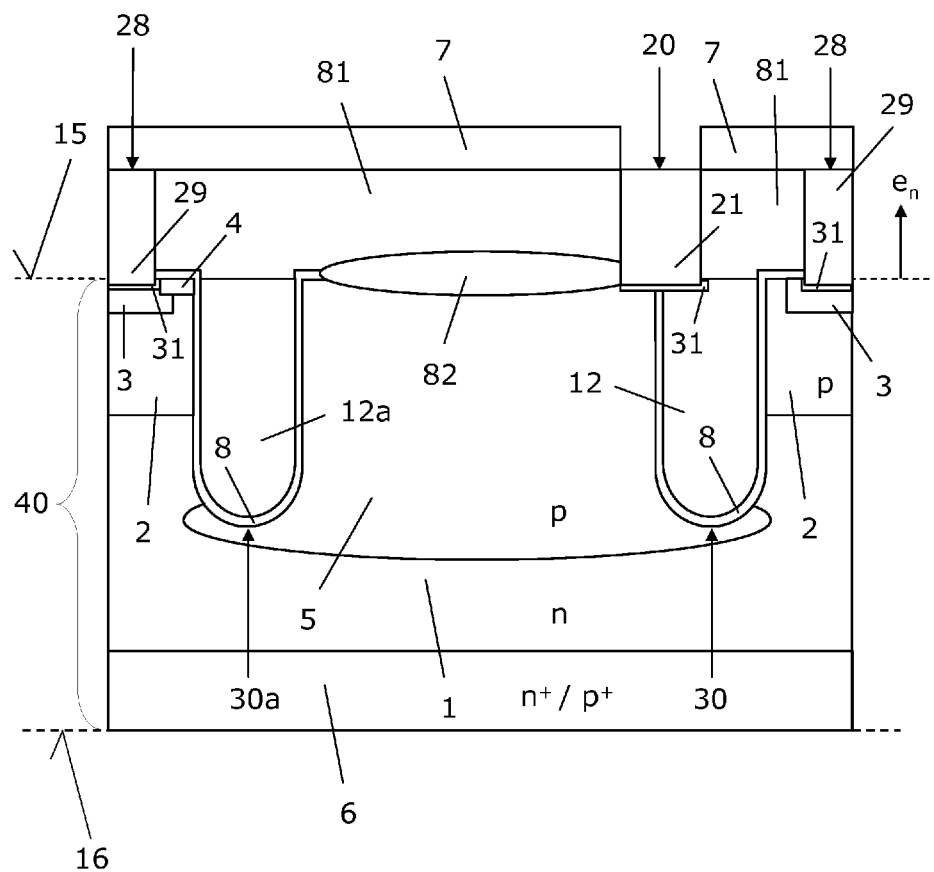
Figure 27:
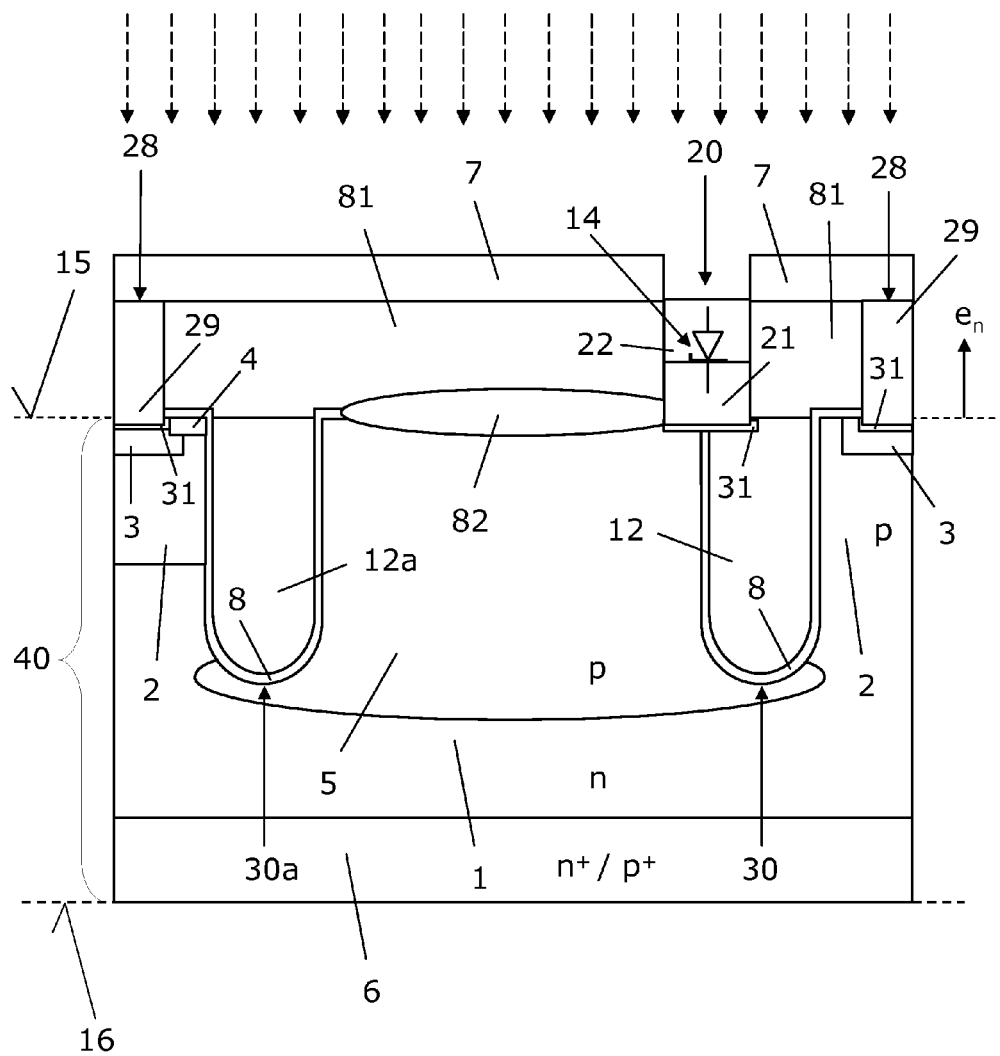

Thereafter, a silicide 31 is formed on the bottom of thin trench 21 and further thin trenches 29 as a salicide. Further, polycrystalline semiconductor region 21 and polycrystalline semiconductor regions 29 are formed in thin trench 21 and further thin trenches 28 similar as explained with reference to FIG. 19. Thereafter, a structured mask 7 is formed on intermediate dielectric layer 81 such that thin trench 20 is exposed. The resulting structure 102 is illustrated in FIG. 26.

Through mask 7, phosphorus ions or arsenic ions are implanted in an upper portion of thin trench 20. This is illustrated by dashed arrows in FIG. 27. After a subsequent thermal process, a horizontally extending pn-junction is formed between a lower polycrystalline semiconductor region 21 and an upper polycrystalline semiconductor region 22.

Figure 28:
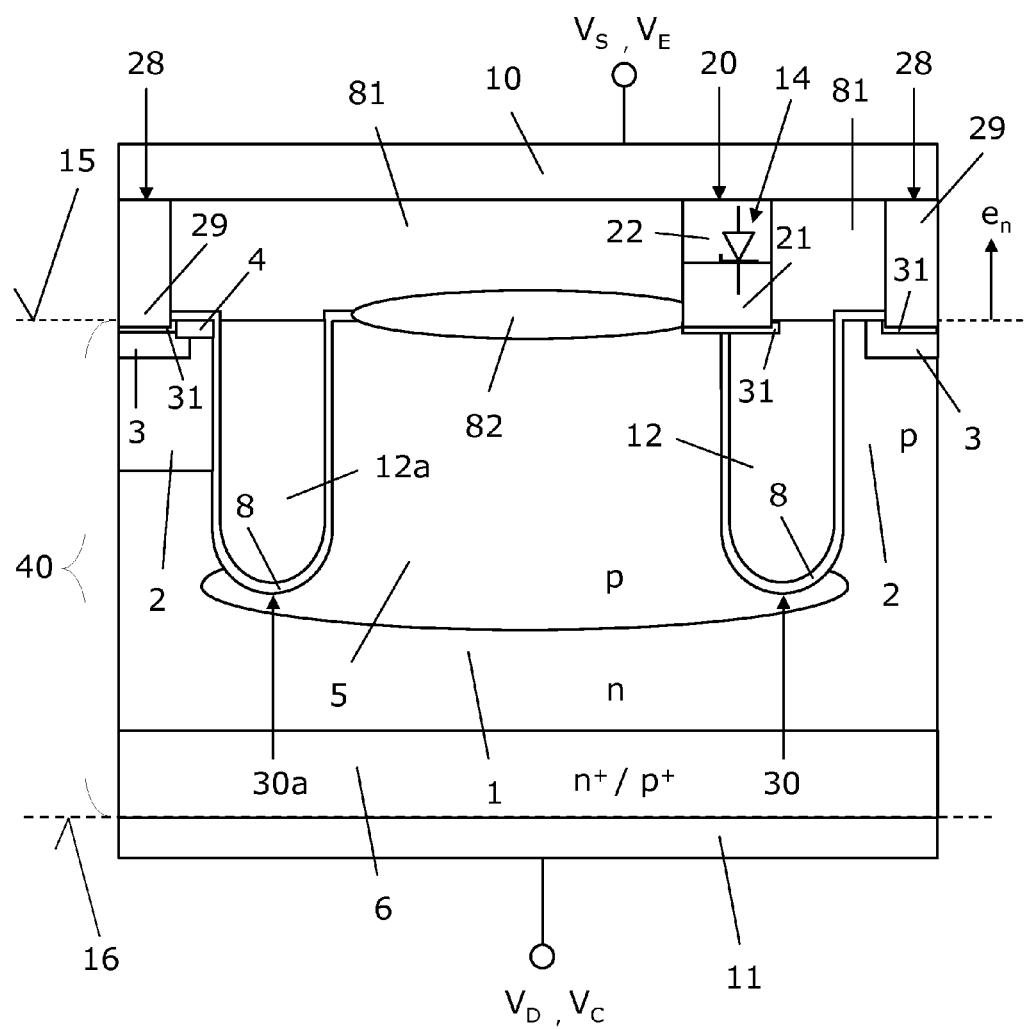

Thereafter, a first metallization 10 in contact with the third semiconductor regions 3 and the fourth semiconductor regions 4 as well as a second metallization 11 in contact with the sixth semiconductor region 6 are formed. The resulting semiconductor structure 102 is illustrated in FIG. 28 and may also be operated as a field effect device with clamped field electrode 12 and clamped body region 5. In other words, semiconductor device 102 is formed such that a current path with a rectifying junction is formed through thin trench 20 and between the first metallization 10 and the conductive region 12 to provide a clamped field electrode and such that a further current path with the rectifying junction is formed through thin trench 20 and between the first metallization 10 and the fifth semiconductor region 5 to provide a clamped body region 5.

Figure 29:
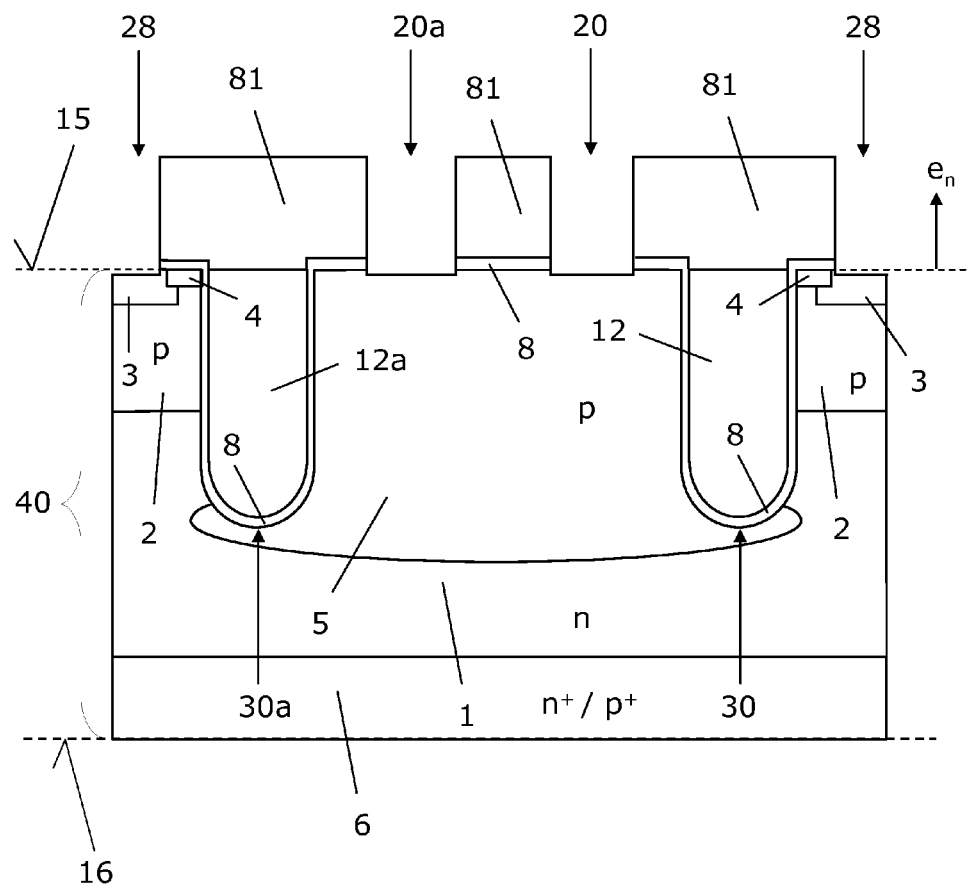
FIGS. 29 and 30 illustrate manufacturing processes according to one or more embodiments.
Figure 30:
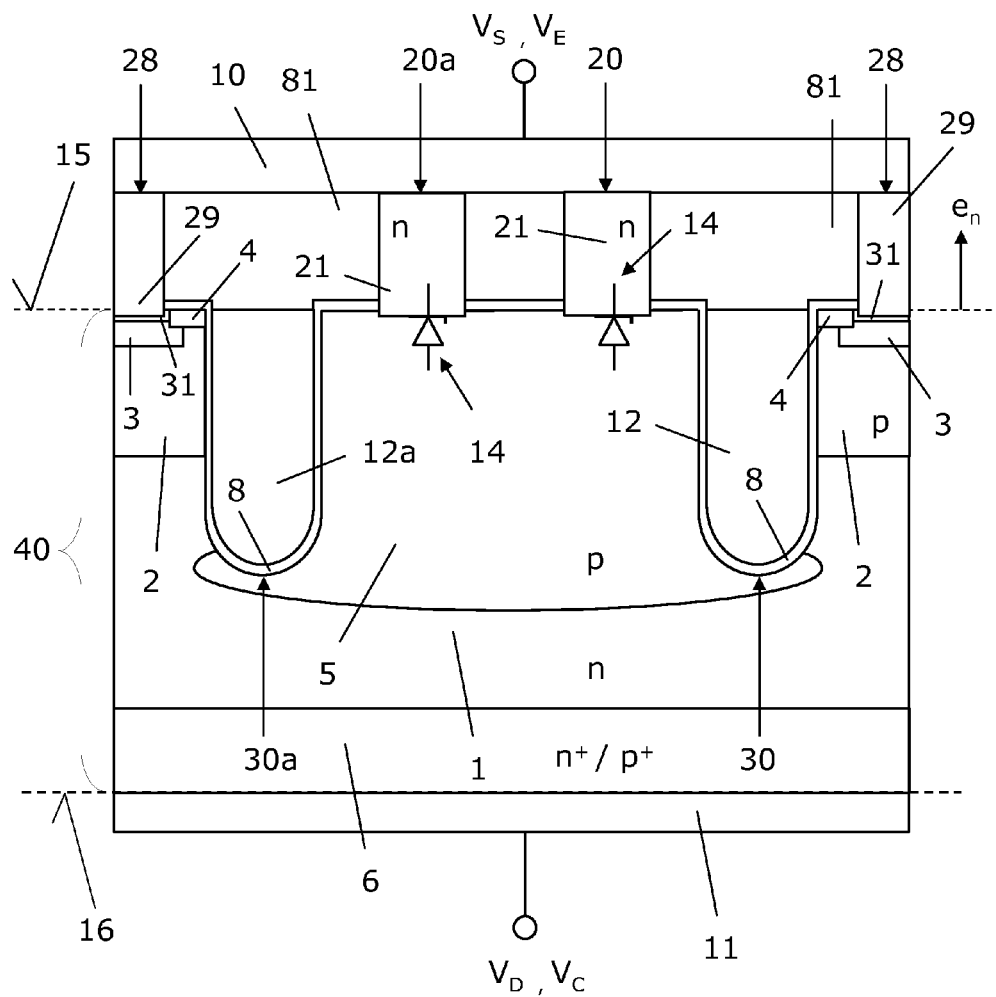

With respect to FIGS. 29 and 30 further processes for forming a semiconductor device 107 according to several embodiments are illustrated in sections of vertical cross-sections. The first processes to form semiconductor device 107 are similar as explained for semiconductor device 101 with reference to FIGS. 11 to 16. Further, the fifth semiconductor region 5 has been formed by implantation such that it extends vertically below the deep trenches 30, 30a.

Thereafter, an intermediate dielectric layer 81 is formed on main horizontal surface 15. In the exemplary embodiment illustrated in FIG. 29, two narrow trench 20, 20a and two optional further narrow trenches 29 are etched through intermediate dielectric layer 81 and thin dielectric layer 8 to expose semiconductor body 40. These processes are similar as explained for semiconductor device 101 with reference to FIGS. 17 and 18. However, etching narrow trenches 20, 20 exposes fifth semiconductor region 5 instead of exposing conductive regions 12 and 12a in deep trenches 30 and 30a, respectively. This is illustrated in FIG. 29.

Thereafter, n-type polycrystalline semiconductor region 21 and 29 are formed in narrow trench 21 and further narrow trenches 28 similar as explained with reference to FIG. 19. Accordingly, a poly-diode 14 is formed between fifth semiconductor region 5 and each of the polycrystalline semiconductor regions 21.

Thereafter, a first metallization 10 in contact with the third semiconductor regions 3 and the fourth semiconductor regions 4 as well as a second metallization 11 in contact with the sixth semiconductor region 6 are formed. The resulting semiconductor structure 102 is illustrated in FIG. 28 and may be operated as a field effect device with clamped body region 5.

To form one or two poly-diode with opposite forward current direction in semiconductor device 107, two polycrystalline semiconductor regions are typically formed in one or both of the two narrow trenches 20, 20a. Further, a silicide layer between the lower of the formed two polycrystalline semiconductor region and fifth semiconductor region 5 is formed as explained with reference to FIG. 28.

The narrow trenches 20, 20a may also include a chain of poly-diodes formed as a stack of polycrystalline semiconductor region with alternating doping type. Such a stack may be formed by several implantation or deposition processes. Note that diffusion of dopants is about 10 times faster in polycrystalline silicon compared to monocrystalline silicon. Accordingly, forming a chain of poly-diodes by implantation is comparatively easy and fast. Typically, poly-diodes are formed after processes carried out at higher temperatures to avoid or at least minimize diffusion of dopants from polycrystalline semiconductor regions into monocrystalline semiconductor regions. In other words, poly-diodes are typically formed as one the last structures but prior to forming the metallizations 10, 11.

The electronic properties of the current paths provided through the narrow trenches 20, 20a may differ. For example, diode 14 provided through trench 20a may be switched anti-parallel to diode 14 provided through trench 20a of semiconductor device 107. In another example, only a resistor is provided through one of the narrow trenches 20, 20a.

The clamped body region and/or the clamped gate electrode and/or clamped field electrode may be connected with a metallization through one or more narrow trenches.

The methods explained herein have in common that a narrow trench is etched at least through an intermediate dielectric layer disposed on a main horizontal surface of the semiconductor body. The narrow trench is etched at least to the semiconductor body and the main horizontal surface, respectively. In so doing, a monocrystalline semiconductor region of the semiconductor body and/or a gate electrode and/or a field electrode arranged in a trench is exposed. A polycrystalline semiconductor layer is deposited such that the narrow trench is at least completely filled, and a polycrystalline semiconductor region is formed in the narrow trench by maskless back-etching of the poly-crystalline semiconductor layer or chemical-mechanical polishing. Further, a first metallization is deposited on the intermediate dielectric layer. The processes are carried out such that a poly-diode, which is at least partially arranged in the narrow trench, is formed between first metallization and the monocrystalline semiconductor region of the semiconductor body and/or the gate electrode. In so doing, a simple method to form a semiconductor device with a clamped monocrystalline semiconductor region and/or clamped gate electrode is provided. The horizontal extension of the narrow trench is typically smaller that the horizontal extension of the deep trench. Due to forming a polycrystalline semiconductor region in the narrow trench by conformal deposition, an integrated poly-diode with low material consumption is provided.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a field effect power semiconductor device, the method comprising:
   providing a semiconductor body comprising a main horizontal surface and a conductive region arranged next to the main horizontal surface;
   forming an insulating layer on the main horizontal surface;
   etching a narrow trench through the insulating layer so that a portion of the conductive region is exposed, the narrow trench comprising, in a given vertical cross-section, a maximum horizontal extension; and
   forming a vertical poly-diode structure comprising a horizontally extending pn-junction, wherein forming the vertical poly-diode structure comprises:
      depositing a polycrystalline semiconductor layer comprising a minimum vertical thickness of at least half of the maximum horizontal extension; and
      maskless back-etching of the polycrystalline semiconductor layer to form a polycrystalline region in the narrow trench.

2. The method of claim 1, wherein the horizontally extending pn-junction is formed between the polycrystalline region and the conductive region.

3. The method of claim 1, wherein the horizontally extending pn-junction is formed in the polycrystalline region arranged in the narrow trench.

4. The method of claim 1, wherein forming the poly-diode structure comprises forming a Zener-diode.

5. The method of claim 1, wherein the conductive region extends to the main horizontal surface.

6. The method of claim 1, wherein the conductive region is a monocrystalline semiconductor region of the semiconductor body, and wherein the conductive region is arranged next to an insulated deep trench disposed in the semiconductor body, the insulated deep trench comprising, in the vertical cross-section, a horizontal extension larger than the maximum horizontal extension of the narrow trench.

7. The method of claim 6, wherein the semiconductor body comprises a first semiconductor region, a second semiconductor region and a pn-junction formed between the first semiconductor region and the second semiconductor region, wherein the insulated deep trench extends vertically below the pn-junction into the first semiconductor region, and wherein the deep trench is arranged between the second semiconductor region and the conductive region, the method further comprising:
   forming a first metallization layer on the insulating layer;
   forming a further narrow trench together with forming the narrow trench; and
   forming a further polycrystalline region in the further narrow trench during depositing the polycrystalline semiconductor layer and maskless back-etching of the polycrystalline semiconductor layer,
   so that a current path comprising a rectifying junction is formed between the first metallization and the conductive region, and an ohmic current path is formed between the first metallization and the second semiconductor region.

8. The method of claim 1, wherein the conductive region is arranged in an insulated deep trench disposed in the semiconductor body, the insulated deep trench comprising, in the vertical cross-section, a horizontal extension larger than the maximum horizontal extension of the narrow trench.

9. The method of claim 8, wherein the semiconductor body comprises a first semiconductor region, a second semiconductor region and a pn-junction formed between the first semiconductor region and the second semiconductor region, wherein the insulated deep trench extends vertically below the pn-junction into the first semiconductor region, the method further comprising:
   forming a first metallization layer on the insulating layer;
   forming a further narrow trench together with forming the narrow trench; and
   forming a further polycrystalline region in the further narrow trench during depositing the polycrystalline semiconductor layer and maskless back-etching of the polycrystalline semiconductor layer,
   so that a current path comprising a rectifying junction is formed between the first metallization and the conductive region, and an ohmic current path is formed between the first metallization and the second semiconductor region.

10. The method of claim 1, further comprising forming a salicide on the exposed portion of the conductive region prior to forming the vertical poly-diode structure.

* * * * *